United States Patent
Tanaka et al.

(10) Patent No.: US 10,854,480 B2
(45) Date of Patent: Dec. 1, 2020

(54) FILM PROCESSING UNIT, SUBSTRATE PROCESSING APPARATUS AND SUBSTRATE PROCESSING METHOD

(71) Applicant: SCREEN HOLDINGS CO., LTD., Kyoto (JP)

(72) Inventors: Yuji Tanaka, Kyoto (JP); Masaya Asai, Kyoto (JP); Masahiko Harumoto, Kyoto (JP); Koji Kaneyama, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 15/772,229

(22) PCT Filed: Oct. 27, 2016

(86) PCT No.: PCT/JP2016/081851
§ 371 (c)(1),
(2) Date: Apr. 30, 2018

(87) PCT Pub. No.: WO2017/082065
PCT Pub. Date: May 18, 2017

(65) Prior Publication Data
US 2018/0315623 A1  Nov. 1, 2018

(30) Foreign Application Priority Data

Nov. 10, 2015  (JP) ................................ 2015-220496

(51) Int. Cl.
*H01L 21/67* (2006.01)
*G03F 7/16* (2006.01)
(Continued)

(52) U.S. Cl.
CPC .......... *H01L 21/67051* (2013.01); *B05B 1/28* (2013.01); *B05C 11/02* (2013.01);
(Continued)

(58) Field of Classification Search
USPC ..................................... 118/52, 612, 326, 66
See application file for complete search history.

(56) References Cited

U.S. PATENT DOCUMENTS

| 4,519,846 A | * | 5/1985 | Aigo ................. H01L 21/67051 |
| | | | 134/15 |
| 5,312,487 A | | 5/1994 | Akimoto et al. ................ 118/52 |

(Continued)

FOREIGN PATENT DOCUMENTS

| JP | 05-160017 A | 6/1993 |
| JP | 06-124887 A | 5/1994 |

(Continued)

OTHER PUBLICATIONS

English Translation JP2012012647A, Jun. 2010. (Year: 2010).*

(Continued)

*Primary Examiner* — Yewebdar T Tadesse
(74) *Attorney, Agent, or Firm* — Ostrolenk Faber LLP

(57) ABSTRACT

A substrate is held and rotated by a spin chuck, and a coating liquid is discharged to the substrate. The coating liquid that is splashed outwardly from the substrate is received by an outer cup. A cleaning liquid that has been discharged from a cup cleaning nozzle is discharged to an inner peripheral surface of the outer cup through a first guide to clean the outer cup. Thus, the coating liquid, its solidified matter and the like adhering to the outer cup are dissolved and removed from the outer cup. Subsequently, a metal removal liquid that has been discharged from the cup cleaning nozzle is discharged to an inner peripheral surface of the outer cup through a second guide. Thus, a metallic component remaining on the outer cup is dissolved and removed from the outer cup.

12 Claims, 16 Drawing Sheets

(51) Int. Cl.
- *B05B 1/28* (2006.01)
- *B05C 11/02* (2006.01)
- *H01L 21/677* (2006.01)
- *H01L 21/687* (2006.01)
- *G03F 7/09* (2006.01)
- *G03F 7/004* (2006.01)
- *G03F 7/30* (2006.01)

(52) U.S. Cl.
CPC ............ *G03F 7/0043* (2013.01); *G03F 7/091* (2013.01); *G03F 7/094* (2013.01); *G03F 7/162* (2013.01); *G03F 7/168* (2013.01); *G03F 7/3021* (2013.01); *H01L 21/6715* (2013.01); *H01L 21/67017* (2013.01); *H01L 21/6719* (2013.01); *H01L 21/67173* (2013.01); *H01L 21/67178* (2013.01); *H01L 21/67742* (2013.01); *H01L 21/68735* (2013.01); *H01L 21/68785* (2013.01); *H01L 21/68792* (2013.01)

(56) References Cited

U.S. PATENT DOCUMENTS

| | | | |
|---|---|---|---|
| 5,677,000 A | 10/1997 | Yoshioka et al. | 427/240 |
| 5,803,970 A * | 9/1998 | Tateyama | G03F 7/162 |
| | | | 118/319 |
| 8,091,504 B2 * | 1/2012 | Hsieh | H01L 21/6715 |
| | | | 118/319 |
| 2001/0037858 A1 | 11/2001 | Taniyama et al. | 156/345 |
| 2014/0030660 A1 | 1/2014 | Takanashi et al. | 430/323 |
| 2015/0241787 A1 * | 8/2015 | Yaegashi | G03D 13/00 |
| | | | 430/296 |

FOREIGN PATENT DOCUMENTS

| | | | | |
|---|---|---|---|---|
| JP | 07-066116 A | | 3/1995 | |
| JP | 09-117708 A | | 5/1997 | |
| JP | H10-68093 A | | 3/1998 | |
| JP | 2001-319910 A | | 11/2001 | |
| JP | 2006-332185 A | | 12/2006 | |
| JP | 2009-239081 A | | 10/2009 | |
| JP | 2012012647 A | * | 1/2012 | ............ C23C 18/10 |
| JP | 2012-203236 A | | 10/2012 | |
| JP | 2013-076973 A | | 4/2013 | |

OTHER PUBLICATIONS

International Search Report dated Jan. 17, 2017 in corresponding PCT International Application No. PCT/JP2016/081851.
Written Opinion dated Jan. 17, 2017 in corresponding PCT International Application No. PCT/JP2016/081851.
Office Action dated Jan. 2, 2018 in corresponding Taiwanese Patent Application No. 105136218.
Office Action dated Nov. 27, 2019 in corresponding Korean Patent Application No. 10-2018-7015365.

* cited by examiner

FILM PROCESSING UNIT, SUBSTRATE PROCESSING APPARATUS AND SUBSTRATE PROCESSING METHOD

CROSS-REFERENCE TO RELATED APPLICATIONS

The present application is a 35 U.S.C. §§ 371 national phase conversion of PCT/JP2016/081851, filed Oct. 27, 2016, which claims priority to Japanese Patent Application No. 2015-220496, filed Nov. 10, 2015, the contents of both of which are incorporated herein by reference. The PCT International Application was published in the Japanese language.

TECHNICAL FIELD

The present invention relates to a film processing unit, a substrate processing apparatus and a substrate processing method.

BACKGROUND ART

In a lithography process in the manufacture of a semiconductor device or the like, a coating liquid such as a resist liquid is supplied onto a substrate, so that a coating film is formed. For example, the substrate is horizontally held and rotated by a spin chuck. In this state, the resist liquid is discharged to a substantially center portion of an upper surface of the substrate from a nozzle, whereby a resist film is formed on the entire upper surface of the substrate as a coating film. In such an apparatus, in order to receive a processing liquid such as a resist liquid splashed from the substrate, a splash prevention member is provided to surround the spin chuck. When the processing liquid adhering to the splash prevention member dries and solidifies, its solidified matter may become particles. Therefore, the splash prevention member is cleaned with use of a solvent and the like (see Patent Document 1, for example).

[Patent Document 1] JP 7-66116 A

SUMMARY OF INVENTION

Technical Problem

In recent years, application of a coating film containing metal (hereinafter referred to as a metal-containing coating film) has been studied for the formation of finer patterns. According to an experiment conducted by the inventors, it is found that, even when a splash prevention member is cleaned with use of a solvent, a metallic component is not removed and remains on the splash prevention member. A substrate or a substrate processing apparatus may be contaminated by a metallic component remaining on the splash prevention member. Further, when the substrate that has been contaminated by the metallic component is transported to an exposure device, the exposure device may be contaminated.

An object of the present invention is to provide a film processing unit, a substrate processing apparatus and a substrate processing method that enable prevention of contamination by metal.

Solution to Problem (1) A film processing unit according to one aspect of the present invention includes a rotation holder that holds and rotates a substrate in a horizontal attitude, a processing liquid supplier that supplies a processing liquid to a surface to be processed of the substrate held by the rotation holder, a splash prevention member that is arranged to surround an outer peripheral end of the substrate held by the rotation holder, and receives the processing liquid splashed from the substrate rotated by the rotation holder, and a removal liquid supplier that is configured to supply a first removal liquid for dissolving metal to the splash prevention member.

In this film processing unit, the processing liquid is supplied to the surface to be processed of the substrate while the substrate is rotated by the rotation holder, and the processing liquid splashed from the substrate is received by the splash prevention member. Therefore, the processing liquid adheres to the splash prevention member. Further, when the film formed on the substrate is processed by the processing liquid, a component of the film adheres to the splash prevention member together with the processing liquid. When the metal is included in the processing liquid or the film on the substrate, the metal may adhere to the splash prevention member. In the above-mentioned configuration, because the first removal liquid is supplied to the splash prevention member, the metal adhering to the splash prevention member can be dissolved and removed. Therefore, the metal is prevented from being diffused from the splash prevention member. As a result, the substrate or another device is prevented from being contaminated by the metal.

(2) The processing liquid supplier may be configured to form a metal-containing coating film on the surface to be processed by supplying a metal-containing coating liquid including metal and a coating liquid to the surface to be processed of the substrate as the processing liquid. In this case, even when the metal in the metal-containing coating liquid supplied to the substrate adheres to the splash prevention member, the metal can be dissolved and removed. Therefore, the metal is prevented from being diffused from the splash prevention member.

(3) A metal-containing coating film may be formed by supply of a metal-containing coating liquid including metal and a coating liquid to the surface to be processed of the substrate, and then exposure processing may be performed on the substrate, and the processing liquid supplier may be configured to supply a development liquid as the processing liquid to the surface to be processed of the substrate on which the exposure processing has been performed. In this case, even when the metal in the metal-containing coating film that has been dissolved by the development liquid adheres to the splash prevention member, the metal can be dissolved and removed. Thus, the metal is prevented from being diffused from the splash prevention member.

(4) The removal liquid supplier may be configured to supply a second removal liquid for dissolving the coating liquid to the splash prevention member. In this case, the coating liquid adhering to the splash prevention member can be dissolved and removed.

(5) The film processing unit may further include a guide member having first and second removal liquid guides, wherein the removal liquid supplier may include a first discharge nozzle that discharges the first removal liquid to the first removal liquid guide of the guide member, and a second discharge nozzle that discharges the second removal liquid to the second removal liquid guide of the guide member, and the first and second removal liquid guides may be provided to respectively guide the first and second removal liquids that have been discharged from the first and second discharge nozzles to the splash prevention member.

In this case, the first and second removal liquids discharged from the first and second discharge nozzles are appropriately supplied to the splash prevention member by the guide member. Thus, the metal and the coating liquid can be efficiently removed from the splash prevention member.

(6) The first removal liquid guide may be provided to guide the first removal liquid to a first region of the splash prevention member, and the second removal liquid guide may be provided to guide the second removal liquid to a second region that is located at a position farther upward than a position of the first region of the splash prevention member. In this case, when the first removal liquid is supplied to the first region of the splash prevention member through the first removal liquid guide, and then the second removal liquid is supplied to the second region of the splash prevention member through the second removal liquid guide, the first removal liquid can be sufficiently cleaned away by the second removal liquid.

(7) The film processing unit may further include a guide member having a removal liquid guide, wherein the removal liquid supplier may include a discharge nozzle that selectively discharges the first and second removal liquids to the removal liquid guide of the guide member, and the removal liquid guide may be provided to respectively guide the first and second removal liquids that have been discharged from the discharge nozzle to the splash prevention member. In this case, the first removal liquid and the second removal liquid can be efficiently supplied to the splash prevention member with a simple configuration.

(8) The film processing unit may further include a removal liquid collection unit that is provided to separately collect the first and second removal liquids that have been discharged to the splash prevention member. In this case, it is not necessary for a user to carry out an operation of separating the used first removal liquid and the used second removal liquid. Thus, the cost for collecting and discarding the first and second removal liquids can be lowered.

(9) The film processing unit may further include a peripheral portion removal liquid supply unit that supplies a third removal liquid for dissolving the metal to a peripheral portion of the surface to be processed of the substrate rotated by the rotation holder such that the metal-containing coating film remains in a region except for the peripheral portion of the surface to be processed of the substrate. In this case, the metal is prevented from remaining on the peripheral portion of the substrate. Thus, the metal is prevented from being diffused from the peripheral portion of the substrate.

(10) A substrate processing apparatus according to another aspect of the present invention that is arranged to be adjacent to an exposure device for performing exposure processing on a substrate includes the above-mentioned film processing unit that forms the metal-containing coating film on a surface to be processed of the substrate before the exposure processing is performed by the exposure device and a development processing unit that performs development processing on the substrate after the exposure processing is performed by the exposure device.

In this substrate processing apparatus, the metal-containing coating film is formed by the film formation unit on the surface to be processed of the substrate that has not been exposed by the exposure device, and the development processing is performed by the development processing unit on the substrate that has been exposed by the exposure device. Thus, fine patterns can be formed on the surface to be processed of the substrate. Further, because the above-mentioned film processing unit is used, the metal is prevented from being diffused from the splash prevention member. Thus, the substrate, or the inside of the substrate processing apparatus or the exposure device is prevented from being contaminated by the metal.

(11) A substrate processing apparatus according to yet another aspect of the present invention that is arranged to be adjacent to an exposure device for performing exposure processing on a substrate includes a film formation unit that forms a metal-containing coating film including metal to a surface to be processed of the substrate before the exposure processing is performed by the exposure device, and the above-mentioned film processing unit that performs development processing on the substrate after the exposure processing is performed by the exposure device.

In this substrate processing apparatus, the metal-containing coating film is formed by the film formation unit on the surface to be processed of the substrate that has not been exposed by the exposure device, and the development processing is performed by the film processing unit on the substrate that has been exposed by the exposure device. Thus, fine patterns can be formed on the surface to be processed of the substrate. Further, because the above-mentioned film processing unit is used, the metal is prevented from being diffused from the splash prevention member. Thus, the substrate, or the inside of the substrate processing apparatus or the exposure device is prevented from being contaminated by the metal.

(12) A substrate processing method according to yet another aspect of the prevent invention includes the steps of holding and rotating a substrate by a rotation holder in a horizontal attitude, supplying a metal-containing coating liquid including metal and a coating liquid to a surface to be processed of the substrate held by the rotation holder using a processing liquid supplier to form a metal-containing coating film on the surface to be processed, receiving the metal-containing coating liquid that is splashed from the substrate rotated by the rotation holder using a splash prevention member that is arranged to surround an outer peripheral end of the substrate held by the rotation holder and supplying a first removal liquid for dissolving metal to the splash prevention member using a removal liquid supplier.

In this substrate processing method, the processing liquid is supplied to the surface to be processed of the substrate while the substrate is rotated by the rotation holder, whereby the metal-containing coating film is formed on the surface to be processed of the substrate. In this case, because the first removal liquid is supplied to the splash prevention member, even when the metal in the metal-containing coating liquid that has been supplied to the substrate adheres to the splash prevention member, the metal can be dissolved and removed. Therefore, the metal is prevented from being diffused from the splash prevention member. As a result, the substrate, the inside of the apparatus or an area around the apparatus is prevented from being contaminated by the metal.

(13) A substrate processing method according to yet another aspect of the present invention includes the steps of supplying a metal-containing coating liquid including metal and a coating liquid to the surface to be processed of a substrate to form a metal-containing coating film, performing exposure processing on the substrate on which the metal-containing coating film is formed, holding and rotating the substrate that has been exposed in a horizontal attitude by a rotation holder, supplying a development liquid to the surface to be processed of the substrate held by the rotation holder using a processing liquid supplier, receiving a development liquid that is splashed from the substrate rotated by the rotation holder using a splash prevention member arranged to surround an outer peripheral end of the substrate held by the rotation holder, and supplying a first removal liquid for dissolving the metal to the splash prevention member using a removal liquid supplier.

With use of this substrate processing method, the metal-containing coating film is formed on the surface to be processed of the substrate, and then the exposure processing is performed on the substrate. Thereafter, the development liquid is supplied to the surface to be processed of the substrate while the substrate is rotated by the rotation holder. Thus, the development processing is performed on the substrate. In this case, because the first removal liquid is supplied to the splash prevention member, even when the metal in the metal-containing coating film that has been dissolved by the development member adheres to the splash prevention member, the metal can be dissolved and removed. Therefore, the metal is prevented from being diffused from the splash prevention member. As a result, the substrate, or the inside of the apparatus or an area around the apparatus is prevented from being contaminated by the metal.

Advantageous Effects of Invention

The present invention prevents the metal from being diffused from the splash prevention member and prevents the substrate or the like from being contaminated by the metal.

BRIEF DESCRIPTION OF THE DRAWINGS

FIG. 7 is a diagram

DESCRIPTION OF EMBODIMENTS

A film processing unit, a substrate processing apparatus and a substrate processing method according to one embodiment of the present invention will be described below with reference to drawings. In the following description, a substrate refers to a semiconductor substrate, a substrate for a liquid crystal display device, a substrate for a plasma display, a substrate for an optical disc, a substrate for a magnetic disc, a substrate for a magneto-optical disc, a substrate for a photomask or the like.

(1) Substrate Processing Apparatus

Figure 1:
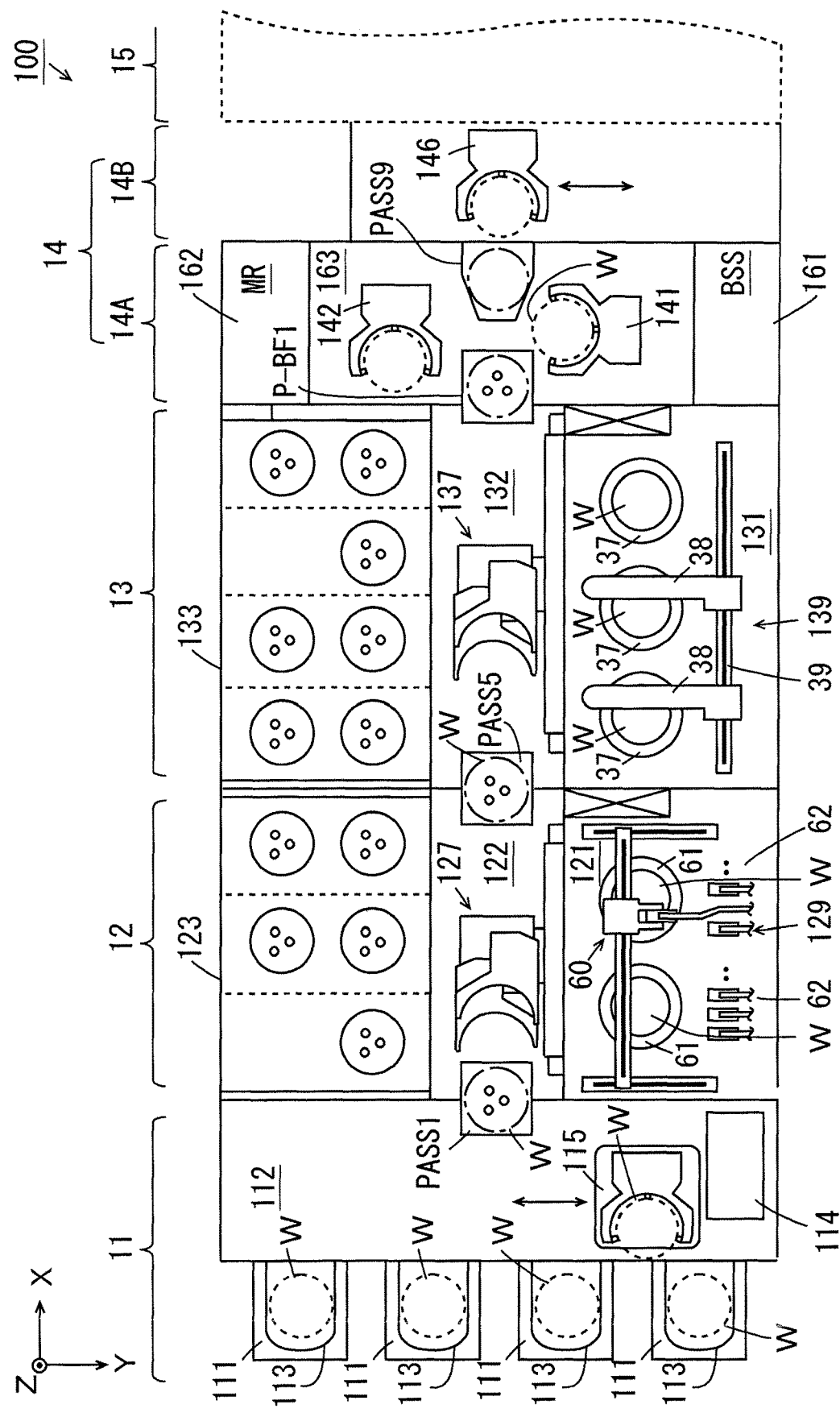
FIG. 1 is a schematic plan view of a substrate processing apparatus according to a first embodiment of the present invention.

FIG. 1 is a schematic plan view of the substrate processing apparatus according to a first embodiment of the present invention. FIG. 1 and the subsequent drawings are accompanied by the arrows that indicate X, Y and Z directions orthogonal to one another for the clarity of a positional relationship. The X and Y directions are orthogonal to each other within a horizontal plane, and the Z direction corresponds to a vertical direction.

As shown in FIG. 1, the substrate processing apparatus 100 includes an indexer block 11, a first processing block 12, a second processing block 13, a cleaning drying processing block 14A and a carry-in carry-out block 14B. An interface block 14 is constituted by the cleaning drying processing block 14A and the carry-in carry-out block 14B. An exposure device 15 is arranged to be adjacent to the carry-in carry-out block 14B. In the present example, the exposure device 15 performs exposure processing on the substrate W using EUV (Extreme Ultra Violet). A wavelength of the EUV is not less than 13 nm and not more than 14 nm.

As shown in FIG. 1, the indexer block 11 includes a plurality of carrier platforms 111 and a transport section 112. In each carrier platform 111, a carrier 113 for storing a plurality of substrates W in multiple stages is placed. In the transport section 112, a main controller 114 and a transport mechanism 115 are provided. The main controller 114 controls various constituent elements of the substrate processing apparatus 100. The transport mechanism 115 transports the substrate W while holding the substrate W.

The first processing block 12 includes a coating processing section 121, a transport section 122 and a thermal processing section 123. The coating processing section 121 and the thermal processing section 123 are provided to be opposite to each other with the transport section 122 interposed therebetween. Substrate platforms PASS1 to PASS4 (see FIG. 12) on which the substrates W are placed are provided between the transport section 122 and the indexer block 11. Transport mechanisms 127, 128 (see FIG. 12) that transport the substrates W are provided in the transport section 122.

The second processing block 13 includes a development processing section 131, a transport section 132 and a thermal processing section 133. The development processing section 131 and the thermal processing section 133 are provided to be opposite to each other with the transport section 132 interposed therebetween. Substrate platforms PASS5 to PASS8 (see FIG. 12) on which the substrates W are placed are provided between the transport section 132 and the transport section 122. Transport mechanisms 137, 138 (see FIG. 12) that transport the substrates W are provided in the transport section 132.

The cleaning drying processing block 14A includes cleaning drying processing sections 161, 162 and a transport section 163. The cleaning drying processing sections 161, 162 are provided to be opposite to each other with the transport section 163 interposed therebetween. Transport mechanisms 141, 142 are provided in the transport section 163. Placement buffer units P-BF1, P-BF2 (see FIG. 12) are provided between the transport section 163 and the transport section 132. The placement buffer units P-BF1, P-BF2 are configured to be capable of storing the plurality of substrates W.

Further, a substrate platform PASS9, below-mentioned edge exposure units EEW (see FIG. 12) and below-mentioned placement cooling units P-CP (see FIG. 12) are provided to be adjacent to the carry-in carry-out block 14B between the transport mechanisms 141, 142. Each placement cooling unit P-CP includes a function of cooling the substrate W (a cooling plate, for example). In the placement cooling unit P-CP, the substrate W is cooled to a temperature suitable for exposure processing. A transport mechanism 146 is provided in the carry-in carry-out block 14B. The transport mechanism 146 carries in the substrate W to and carries out the substrate W from the exposure device 15.

Figure 2:
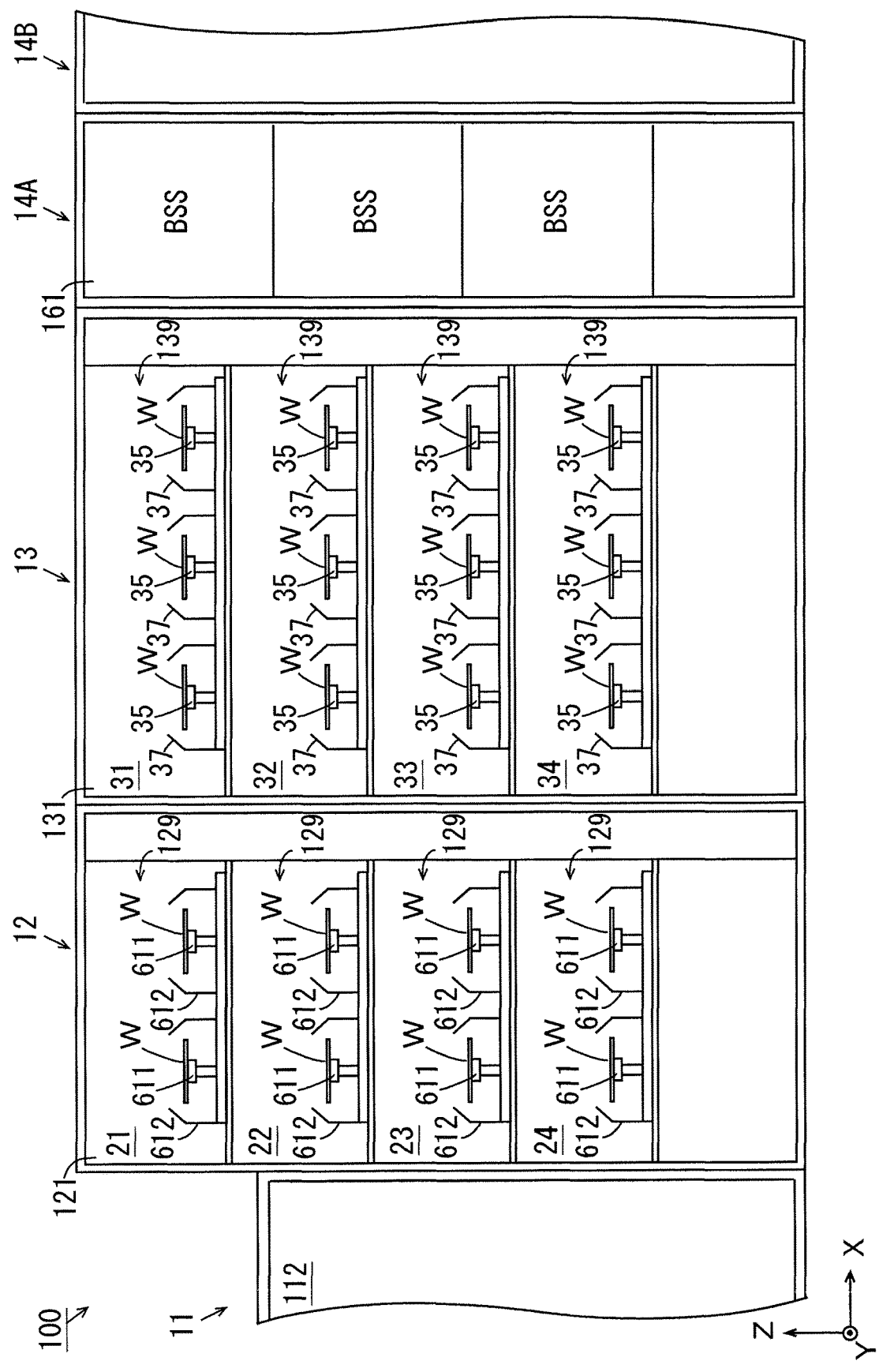
FIG. 2 is a schematic side view showing inner configurations of a coating processing section, a development processing section and a cleaning drying processing section of FIG. 1.

(2) Coating Processing Section, Development Processing Section and Cleaning Drying Processing Section FIG. 2 is a schematic side view showing inner configurations of the coating processing section 121, the development processing section 131 and the cleaning drying processing section 161 of FIG. 1. As shown in FIG. 2, in the coating processing section 121, coating processing chambers 21, 22, 23, 24 are provided in a stack. A coating processing unit 129 is provided in each of the coating processing chambers 21 to 24. In the development processing section 131, development processing chambers 31 to 34 are provided in a stack. A development processing unit 139 is provided in each of the development processing chambers 31 to 34.

(2-1) Coating Processing Units

Figure 3:
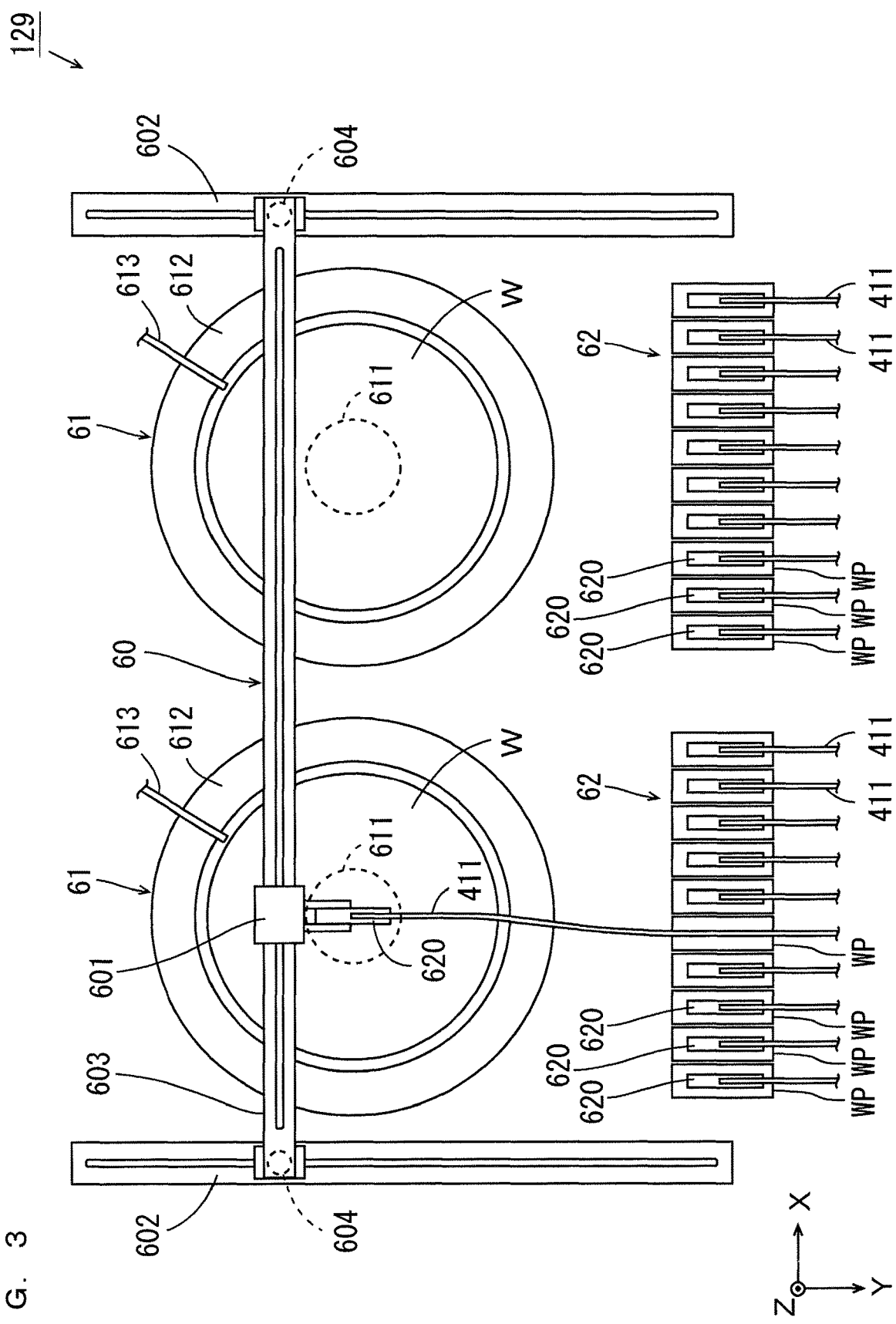
FIG. 3 is a schematic plan view showing a configuration of a coating processing unit.

FIG. 3 is a schematic plan view showing a configuration of the coating processing unit 129. As shown in FIG. 3, each coating processing unit 129 includes a nozzle transport mechanism 60, two spin units 61 and two nozzle units 62. The nozzle transport mechanism 60 includes a gripper 601, a pair of first guide rails 602, a second guide rail 603 and a pair of cylinders 604. The pair of first guide rails 602 is arranged in parallel to each other with the two spin units 61 and the two nozzle units 62 interposed therebetween. The second guide rail 603 is arranged to be orthogonal to the pair of first guide rails 602. Both ends of the second guide rail 603 are respectively attached to the pair of first guide rails 602 via the pair of cylinders 604. The second guide rail 603 is movable along the first guide rails 602 and can be lifted and lowered with respect to the first guide rails 602 by the pair of cylinders 604. The gripper 601 is provided to be movable along the second guide rail 603.

Each spin unit 61 includes a spin chuck 611 (FIG. 2), a cup 612 and an edge rinse nozzle 613. Rotation of the spin chuck 611 is driven by a motor 71 (FIG. 4), described below, while holding the substrate W. The cup 612 is provided to surround the outer peripheral end of the substrate W held by the spin chuck 611. Details of the spin chuck 61 will be described below.

Each nozzle unit 62 includes a plurality of nozzles 620 and a plurality of waiting pods WP. Each nozzle 620 waits in a corresponding waiting pod WP. A metal-containing coating liquid including metal and a coating liquid is supplied to each nozzle 620 through a coating liquid pipe 411. The metal includes a metallic component such as metallic molecules or metallic oxide. In the present example, Sn (tin), $HfO_2$ (hafnium oxide) or $ZrO_2$ (zirconium dioxide), for example, is used as the metallic component. Further, a coating liquid for an anti-reflection film and a coating liquid for a resist film are used as coating liquids.

The number of the spin units 61 is not limited to two, and the number of the nozzle units 62 is not limited to two. Only one spin unit 61 and only one nozzle unit 62 may be provided. Alternatively, three or more spin units 61 and three or more nozzle units 62 may be provided. Further, the number of the spin units 61 may be different from the number of the nozzle units 62.

The nozzle transport mechanism 60 holds any one of the nozzles 620 using the gripper 601 and moves the nozzle 620 to a position above the substrate W. In this state, the metal-containing coating liquid is discharged from the nozzle 620 while the spin chuck 611 is rotated. Thus, the metal-containing coating liquid is applied onto the rotating substrate W.

In the present embodiment, the metal-containing coating liquid including a coating liquid for an anti-reflection film is supplied to the nozzle 620 in the coating processing chambers 22, 24 of FIG. 2, and the metal-containing coating liquid including a coating liquid for a resist film is supplied to the nozzles 620 in the coating processing chambers 21, 23. Hereinafter, the anti-reflection film and the resist film formed of the metal-containing coating liquid are collectively termed as the metal-containing coating films.

Each edge rinse nozzle 613 is arranged to be directed to a peripheral portion of a surface to be processed of a substrate W held by the spin chuck 611. Here, the surface to be processed refers to a surface of the substrate W on which various types of patterns such as a circuit pattern is formed. The peripheral portion of the substrate W refers to a region, having a constant width and extending along an outer periphery of the substrate W, of the surface to be processed of the substrate W.

Each edge rinse nozzle 613 discharges a film removal liquid for removing the metal-containing coating film from the peripheral portion of the substrate W. The film removal liquid is an example of a second removal liquid. In addition to an organic solvent including a thinner, butyl acetate, PGMEA (propyleneglycol monomethyl ether acetate) and PGME (propyleneglycol monomethyl ether), an aqueous solution including TMAH (tetra methyl ammonium hydroxide), an aqueous solution including ammonia and a hydrogen peroxide solution, or the like may be used as the film removal liquid.

With the substrate W rotated by the spin chuck 611, the film removal liquid is discharged to the peripheral portion of the substrate W from the edge rinse nozzle 613. Thus, the coating liquid that has been applied to the peripheral portion of the substrate W is dissolved and removed.

Figure 4:
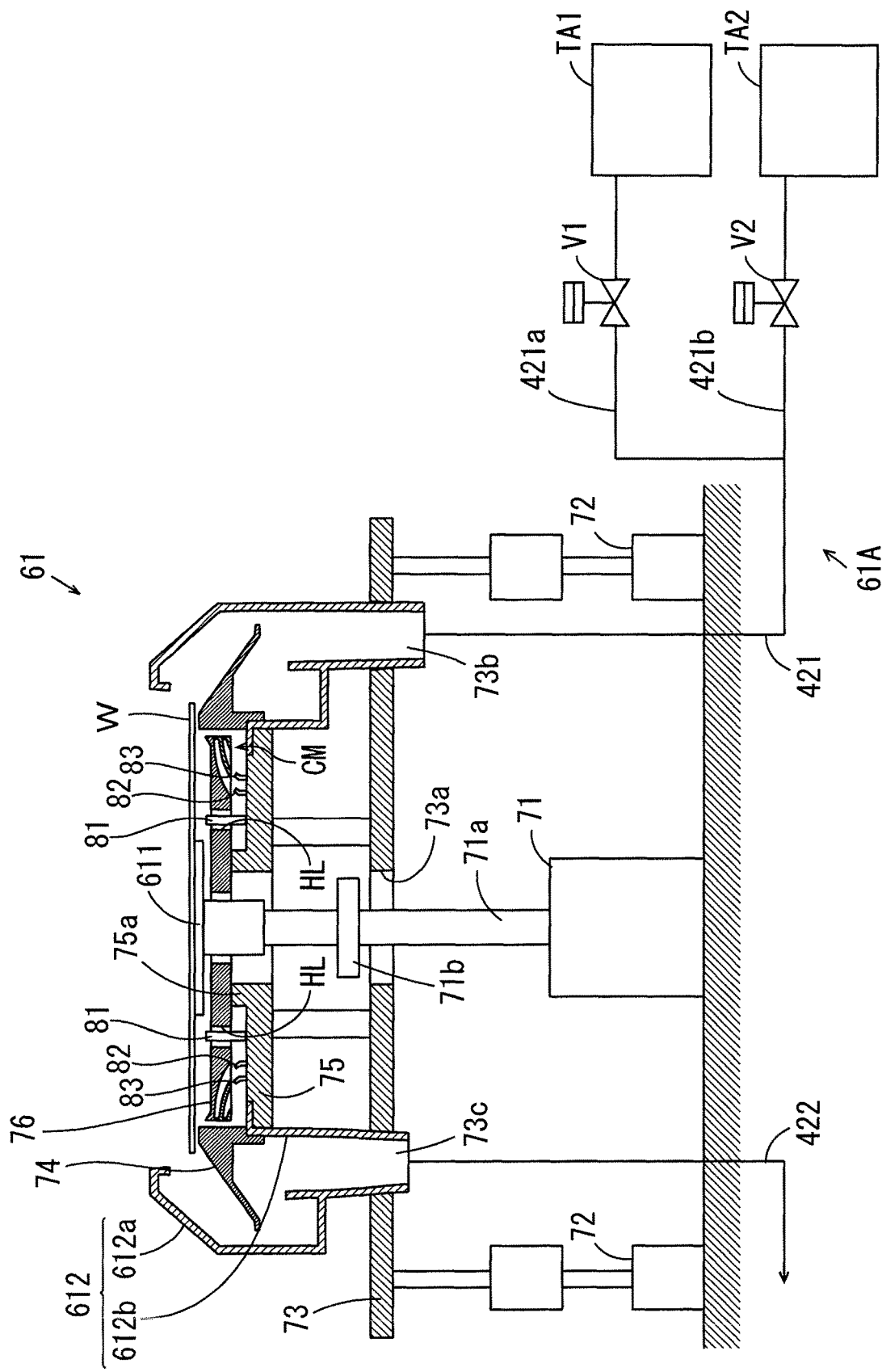
FIG. 4 is a schematic side view for explaining details of a spin unit.
Figure 5:
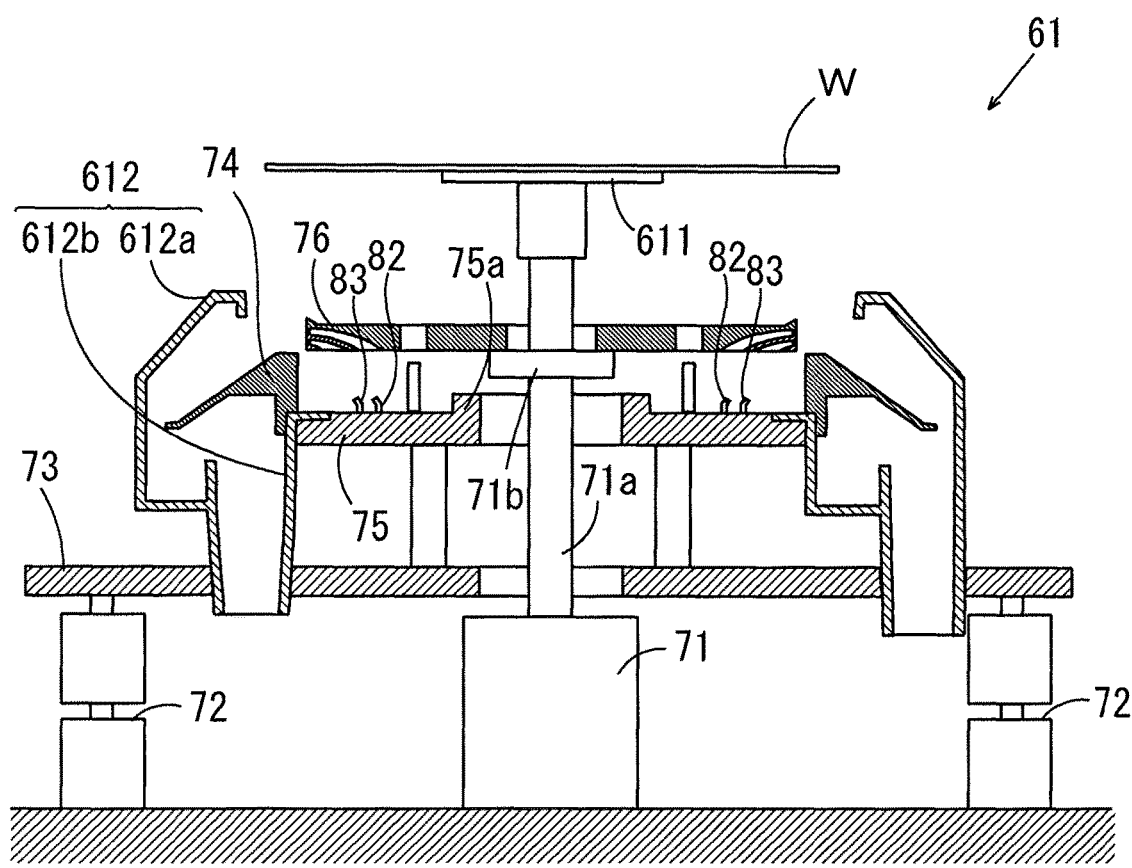
FIG. 5 is a schematic side view for explaining the details of the spin unit.

FIGS. 4 and 5 are schematic side views for explaining the details of the spin unit 61. In FIGS. 4 and 5, the edge rinse nozzle 613 is not shown. As shown in FIG. 4, the spin unit 61 further includes a motor 71 and a pair of lifting lowering mechanisms 72. A rotation shaft 71a of the motor 71 is arranged vertically. The spin chuck 611 is fixed to an upper end of the rotation shaft 71a. In a portion of the rotation shaft 71a below the spin chuck 611, a fixing portion 71b is provided to project outwardly.

The pair of lifting lowering mechanisms 72 is respectively made of cylinders, for example, and supports a lifting lowering plate 73 horizontally. An opening 73a, a liquid drainage port 73b and a gas exhaust port 73c are formed in the lifting lowering plate 73. The rotation shaft 71a of the motor 71 is arranged in the opening 73a. A pipe 421 is connected to the liquid drainage port 73b. The pipe 421 branches into pipes 421a, 421b, and extends to collection tanks TA1, TA2. A collection valve V1 is provided at the pipe 421a, and a collection valve V2 is provided at the pipe 421b. A collection unit 61A is constituted by the pipes 421, 421a, 421b, the collection tanks TA1, TA2 and the collection valves V1, V2. When the collection valves V1, V2 are opened selectively, the liquid drained from the liquid drainage port 73b is selectively guided to the collection tanks TA1, TA2. In the present example, the film removal liquid and the below-mentioned cleaning liquid are guided to the collection tank TA1, and a metal removal liquid, described below, is guided to the collection tank TA2. In addition to the collection tanks TA1, TA2, a collection tank for collecting the metal-containing coating liquid may be provided. Further, a pipe for discarding each liquid, which is drained from the liquid drainage port 73b, without collecting the liquid may be provided separately. A pipe 422 is connected to the gas exhaust port 73c. The pipe 422 extends to a gas exhaust line of a factory.

A cup 612 is provided at an upper surface of the lifting lowering plate 73. The cup 612 includes an outer cup 612a and an inner cup 612b. A straightening member 74 that extends obliquely outwardly and downwardly is provided in an upper portion of the inner cup 612b. The straightening member 74 adjusts a flow of gas such that a downflow supplied to the coating processing unit 129 uniformly flows around the substrate W and is guided to the gas exhaust port 73c.

A base portion 75 is provided at a position farther upward than the lifting lowering plate 73 and farther inward than the inner cup 612b. At an upper surface of the base portion 75, a plurality of back rinse nozzles 81, a plurality of cup cleaning nozzles 82 and a plurality of cup cleaning nozzles 83 are provided. The plurality of back rinse nozzles 81 are directed vertically upwardly. The plurality of cup cleaning nozzles 82 are respectively provided at positions farther outward than the plurality of back rinse nozzles 81. The plurality of cup cleaning nozzles 83 are respectively provided at positions farther outward than the plurality of cup cleaning nozzles 82.

A cleaning liquid is supplied from a cleaning liquid supply source (not shown) to each back rinse nozzle 81 and each cup cleaning nozzle 82. In the present example, the cleaning liquid supplied to the back rinse nozzle 81 and the cup cleaning nozzle 82 is the same as the film removal liquid discharged from the edge rinse nozzle 613 of FIG. 3. Each back rinse nozzle 81 discharges the cleaning liquid to the back surface of the substrate W held by the spin chuck 611.

The metal removal liquid is supplied to each cup cleaning nozzle 83 from a metal removal liquid supply source (not shown). The metal removal liquid is an example of a first removal liquid. As the metal removal liquid, an alkaline removal liquid or an acid removal liquid is used. The alkaline removal liquid is an aqueous solution including ammonia and hydrogen peroxide, for example. The alkaline removal liquid may be TMAH, for example. The acid removal liquid is an aqueous solution including diluted hydrofluoric acid, for example. The acid removal liquid may also be an aqueous solution including sulfuric acid and hydrogen peroxide, or an aqueous solution including acetic acid, for example. Further, an aqueous solution including a chelating agent may be used as the metal removal liquid. The chelating agent may include one type or a plurality of types selected from a group including an organic acid, an organic acid salt, an amino acid, an amino acid derivative, inorganic alkali, an inorganic alkali salt, an alkilamine, an alkilamine derivative, an alkanolamine and an alkanolamine derivative. The metal removal liquid can dissolve and remove a metallic component included in the metal-containing coating liquid.

A support portion 75a is provided to project upwardly from an inner periphery of the base portion 75. A disc-shaped cup cleaning member 76 is supported on the support portion 75a. A plurality of holes HL are provided in the cup cleaning member 76. A back rinse nozzle 81 is arranged in each hole HL. A cup cleaning mechanism CM is constituted by cup cleaning nozzles 82, 83 and a cup cleaning member 76.

The lifting lowering plate 73 is lifted and lowered by the pair of lifting lowering mechanisms 72, and the cup 612 (an outer cup 612a and an inner cup 612b) is lifted and lowered integrally with the lifting lowering plate 73. The cup 612 is lifted and lowered among a process position, a carry-in carry-out position and a cleaning position. In FIG. 4, the cup 612 is at the process position. The carry-in carry-out position is lower than the process position, and the cleaning position is lower than the carry-in carry-out position.

When the cup 612 is at the process position of FIG. 4, an upper end of the outer cup 612a is at a position higher than the substrate W held by the spin chuck 611, and an upper end of the straightening member 74 is in close proximity to a peripheral portion of a lower surface of the substrate W. In this state, the metal-containing coating liquid is discharged from the nozzle 620 of FIG. 3 to the substrate W while the substrate W held by the spin chuck 611 is rotated, and the metal-containing coating film is formed on the substrate W. The metal-containing coating film that is splashed outwardly from the substrate W is received by the outer cup 612a.

With the cup 612 at the carry-in carry-out position, the upper end of the outer cup 612a is lower than the substrate W held by the spin chuck 611. In this state, the substrate W is placed on the spin chuck 611 by the transport chambers 127, 128 of FIG. 1 and FIG. 12, described below, or the substrate W is received from the spin chuck 611.

With the cup 612 at the cleaning position, the cleaning processing is performed on the cup 612. A period during which the cleaning processing is performed is a period during which the processing for the substrate W is suspended for a certain period of time in the coating processing unit 129, for example. In FIG. 5, the cup 612 is at the cleaning position. As shown in FIG. 5, the cup cleaning member 76 is supported by the fixing portion 71b to be spaced apart from the support portion 75a. In this case, the cup cleaning member 76 is fixed to the fixing portion 71b by a fixing mechanism (not shown). For example, a pin is provided to project from a lower surface of the cup cleaning member 76, and a recess is provided in the fixing portion 71b. The pin of the cup cleaning member 76 is fitted into the recess of the fixing portion 71b, whereby the cup cleaning member 76 is fixed to the fixing portion 71b. Thus, the cup cleaning member 76 is rotated together with the rotation shaft 71a of the motor 71.

Figure 6:
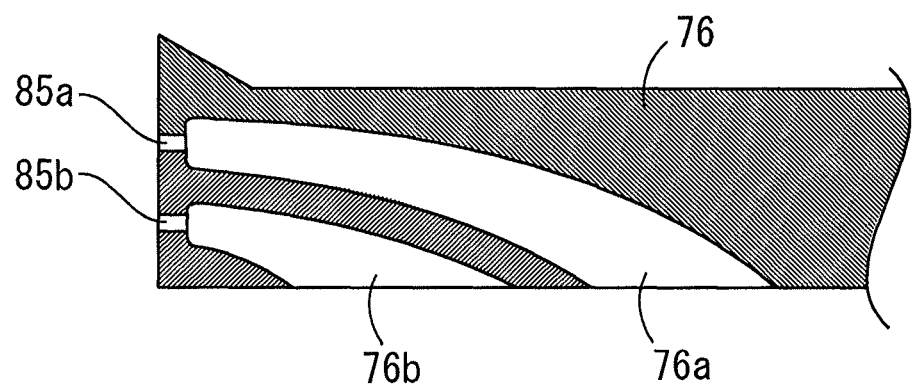
FIG. 6 is a partially enlarged cross sectional view of a cup cleaning member.

FIG. 6 is a partially enlarged cross sectional view of the cup cleaning member 76. As shown in FIG. 6, first and second guides 76a, 76b are formed in the cup cleaning member 76. The first and second guides 76a, 76b are respectively provided in a concave shape to extend from a lower surface to a peripheral portion of the cup cleaning member 76 while being curved. Further, the first and second guides 76a, 76b are respectively provided to be annular and rotationally symmetric about the rotation shaft 71a of FIG. 4. A lower end opening of the second guide 76b is located at a position farther outward than a lower end opening of the first guide 76a, and an outer end of the second guide 76b is located at a position farther downward than the outer end of the first guide 76a.

A plurality of discharge ports 85a are formed to be arranged in a circumferential direction from an outer peripheral surface of the cup cleaning member 76 to an outer end of the first guide 76a, and a plurality of discharge ports 85b are formed to be arranged in the circumferential direction from the outer peripheral surface of the cup cleaning member 76 to an outer end of the second guide 76b. The plurality of discharge ports 85b are located at positions farther downward than the plurality of discharge ports 85a.

When the cup 612 is at the cleaning position of FIG. 5, the cup cleaning nozzle 82 is directed to the first guide 76a, and the cup cleaning nozzle 83 is directed to the second guide 76b. Further, the discharge ports 85a, 85b of the cup cleaning member 76 are located at positions higher than the upper end of the straightening member 74 and lower than the upper end of the outer cup 612a.

Figure 7A:
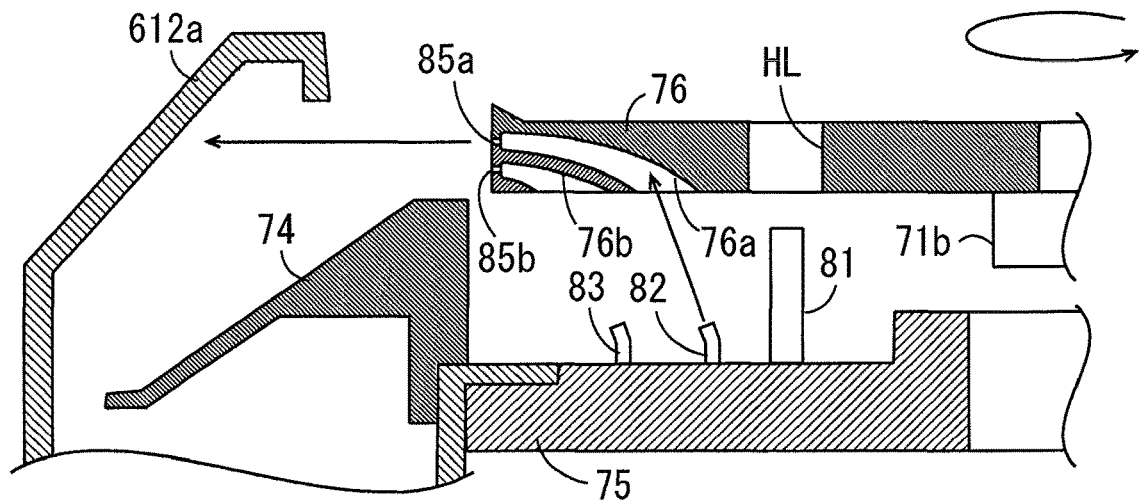
FIGS. 7A to 7C are diagrams for explaining a specific example of cleaning processing for a cup.
Figure 7B:
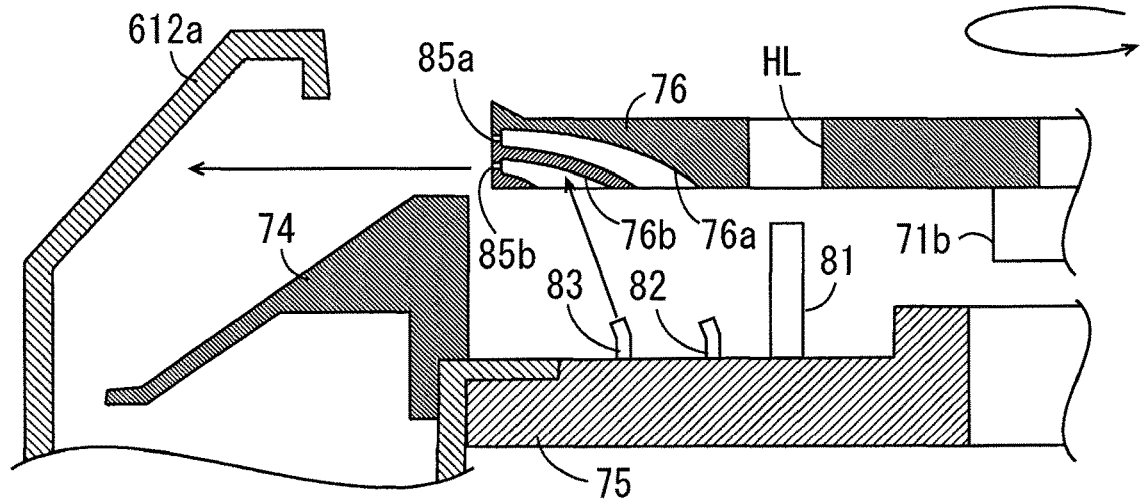
Figure 7C:
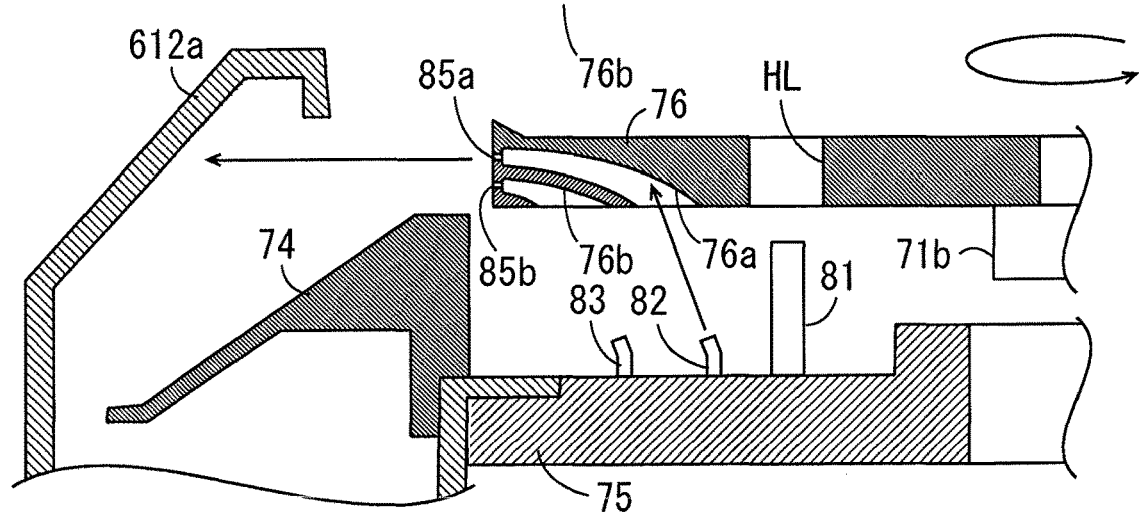

FIGS. 7A to 7C are diagrams for explaining a specific example of the cleaning processing for the cup 612. As shown in FIG. 7A, at first, the cleaning liquid is discharged from the cup cleaning nozzle 82 to the first guide 76a while the cup cleaning member 76 is rotated. The discharged cleaning liquid is guided to the discharge ports 85a through the first guide 76a and discharged to an inner peripheral surface of the outer cup 612a from the discharge ports 85a. In this case, because the cup cleaning member 76 is rotated, the cleaning liquid is supplied to the entire inner peripheral surface of the outer cup 612a in the circumferential direction. Thus, the coating liquid, its solidified matter and the like adhering to the outer cup 612a are dissolved and removed from the outer cup 612a.

Subsequently, as shown in FIG. 7B, the metal removal liquid is discharged from the cup cleaning nozzle 83 to the second guide 76b while the cup cleaning member 76 is rotated. The discharged metal removal liquid is guided to the discharge ports 85b through the second guide 76b and discharged to the inner peripheral surface of the outer cup 612a from the discharge ports 85b. Also in this case, because the cup cleaning member 76 is rotated, the metal removal liquid is supplied to the entire inner peripheral surface of the outer cup 612a in the circumferential direction.

Even when the cleaning liquid is supplied to the outer cup 612a as described above, the metallic component contained in the metal-containing coating film might not be removed sufficiently and may remain on the outer cup 612a. As such, in addition to the cleaning liquid, the metal removal liquid is supplied to the outer cup 612a. Thus, the metallic component remaining on the outer cup 612a is dissolved and removed from the outer cup 612a.

Next, as shown in FIG. 7C, the cleaning liquid is discharged from the cup cleaning nozzle 82 to the first guide 76a again while the cup cleaning member 76 is rotated. Thus, the metal removal liquid adhering to the outer cup 612a is cleaned away. Because the plurality of discharge ports 85a are located at positions farther upward than the plurality of discharge ports 85b, the cleaning liquid that has been discharged from the discharge ports 85a arrives at positions higher than the positions at which the metal removal liquid that has been discharged from the discharge ports 85b arrive on the inner peripheral surface of the outer cup 612a, and flows downwardly from the positions along the inner peripheral surface of the outer cup 612a. Thus, on the inner peripheral surface of the outer cup 612a, the region to which the cleaning liquid is supplied is larger than the region to which the metal removal liquid is supplied. Therefore, the metal removal liquid is cleaned away sufficiently by the cleaning liquid, and the metal removal liquid is prevented from remaining on the outer cup 612a. Pure water may be discharged from the cup cleaning nozzle 82 instead of the cleaning liquid in order to clean away the metal removal liquid.

In a period during which the cleaning liquid is discharged from the cup cleaning nozzle 82, the collection valve V1 of FIG. 4 is opened, and the collection valve V2 is closed. Thus, the cleaning liquid drained from the liquid drainage ports 73b is guided to the collection tank TA1 of FIG. 4. On the other hand, in a period during which the metal removal liquid is discharged from the cup cleaning nozzle 83, the collection valve V1 of FIG. 4 is closed, and the collection valve V2 is opened. Thus, the metal removal liquid drained from the liquid drainage ports 73b is guided to the collection tank TA2 of FIG. 4. In this manner, the used cleaning liquid and the used metal removal liquid are separately collected. Thus, it is not necessary for a user to carry out an operation of separating the cleaning liquid and the metal removal liquid. Therefore, the cost for collecting and discarding the removal liquid can be lowered.

While the cleaning liquid, the metal removal liquid and the cleaning liquid (or pure water) are sequentially supplied to the outer cup 612a in the example of FIGS. 7A to 7C, the present invention is not limited to this. Not the cleaning liquid but the metal removal liquid may be supplied to the outer cup 612a first, and the cleaning liquid may be subsequently supplied to the cup 612. In this case, the metallic component is removed from the outer cup 612a by the metal removal liquid. After that, the cleaning liquid, a solidified matter and the like are removed from the outer cup 612a and the metal removal liquid is cleaning away, by the cleaning liquid.

While only one type of a metal removal liquid is used in the cleaning processing for the cup 612 in the example of FIGS. 7A to 7C, a plurality of types of metal removal liquids may be used. In this case, the plurality of types of metal removal liquids may be sequentially supplied to the outer cup 612a, or any of the metal removal liquids may be selectively supplied to the outer cup 612a.

While each liquid is discharged to the outer cup 612a from the discharge ports 85a, 85b of the cup cleaning member 76 in the example of FIGS. 7A to 7C, each liquid may be discharged to the straightening member 74 of the inner cup 612b. For example, when the discharge ports 85a, 85b are in a vertically elongated rectangle shape, an area to which each liquid is supplied expands in the vertical direction, and each liquid can be discharged to the straightening member 74. Further, holes directed to the outer cup 612a and holes directed to the straightening member 74 may be respectively formed as discharge ports 85a, and similarly, holes directed to the outer cup 612a and holes directed to the straightening member 74 may be respectively formed as discharge ports 85b.

Figure 8:
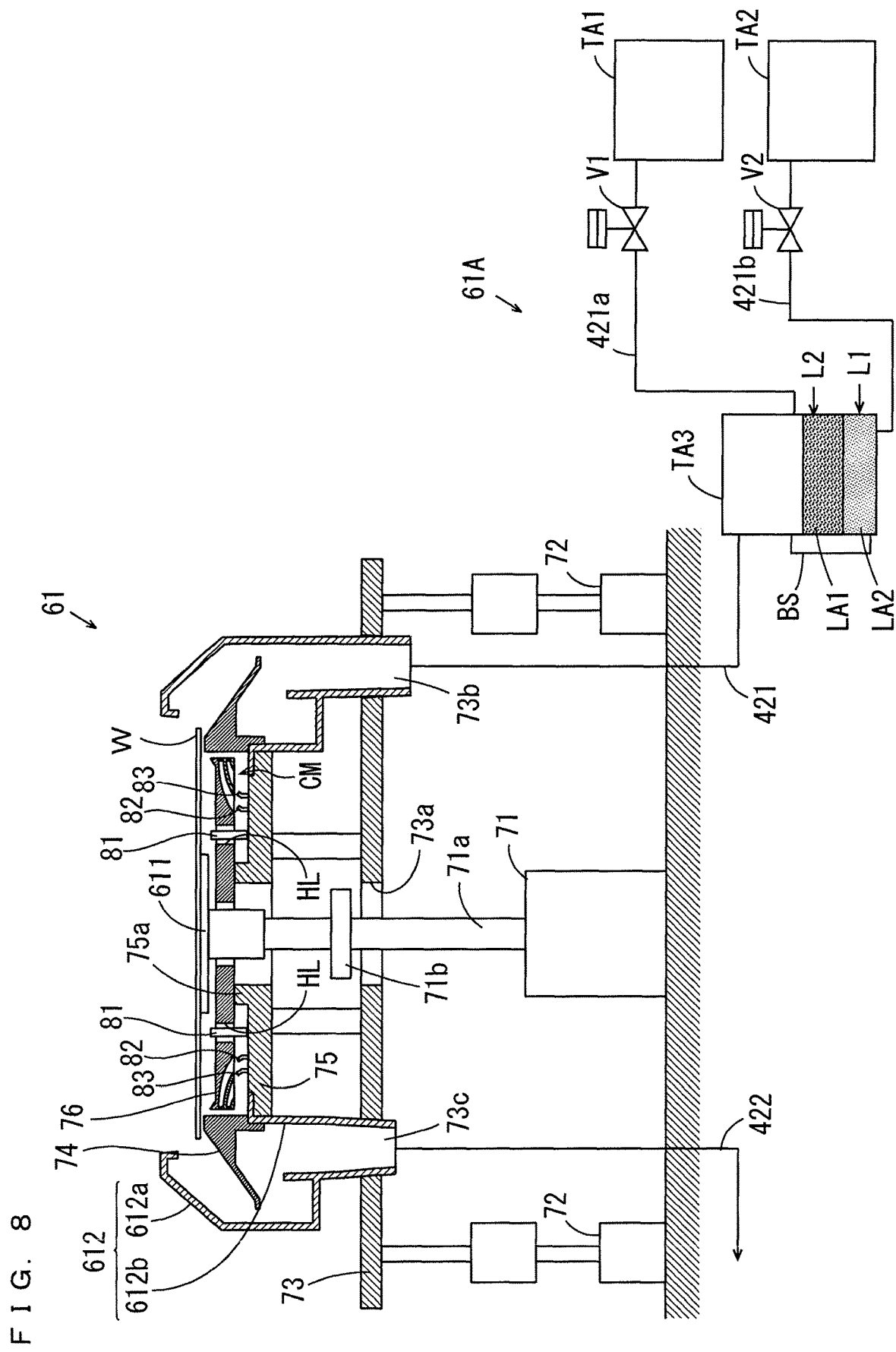
FIG. 8 is a diagram for explaining another example of a collection unit.

The configuration for collecting the cleaning liquid and the metal removal liquid is not limited to the above-mentioned example. FIG. 8 is a diagram for explaining another example of the collection unit 61A. As for the example of FIG. 8, differences from the example of FIG. 4 will be described.

In the example of FIG. 8, a pipe 421 is connected to a separate tank TA3. Further, the separate tank TA3 is connected to collection tanks TA1, TA2 through pipes 421a, 421b. In this case, the cleaning liquid and the metal removal liquid are guided to the common separate tank TA3 from a liquid drainage port 73b of a cup 612.

Here, the cleaning liquid and the metal removal liquid have specific gravities that are different from each other, and the specific gravity of the metal removal liquid is larger than that of the cleaning liquid. Therefore, in the collection tank TA3, a layer LA1 of the cleaning liquid and a layer LA2 of the metal removal liquid are formed to be separated from each other in the vertical direction. As such, a boundary detector BS that detects a boundary surface between the layer LA1 and the layer LA2 is provided in the collection tank TA3. As the boundary detector BS, a capacitance type liquid surface level sensor is used, for example. A liquid surface level sensor of another type such as a float type, an optical type, an ultrasonic type, an electrical conductivity type or a piezo resonance type may be used as the boundary detector BS instead.

A lower limit height L1 and an upper limit height L2 of the boundary surface between the layer LA1 and the layer LA2 are set in the separate tank TA3. The upper limit height L2 is located above the lower limit height L1. In the separate tank TA3, a pipe 421a is attached to a position higher than the upper limit height L2, and a pipe 421b is attached to a position lower than the lower limit height L1.

For example, when the height of the boundary surface detected by the boundary detector BS is lower than the lower limit height L1, the collection valve V2 is closed. Thus, the cleaning liquid is prevented from being guided to the collection tank TA2 through the pipe 421b. In this case, the collection valve V1 may be opened or closed. When the height of the boundary surface detected by the boundary detector BS is equal to or higher than the lower limit height L1 and lower than the upper limit height L2, the collection valves V1, V2 are opened. Thus, the cleaning liquid and the metal removal liquid are guided to the collection tanks TA1, TA2 through the pipes 421a, 421b, respectively. When the height of the boundary surface detected by the boundary detector BS is equal to or higher than the upper limit height L2, the collection valve V2 is opened, and the collection valve V1 is closed. Thus, the metal removal liquid is guided to the collection tank TA2 through the collection pipe 421b. Further, the metal removal liquid is prevented from being guided to the collection tank TA1 through the collection pipe 421a.

In this manner, in the example of FIG. 8, the used cleaning liquid and the used metal removal liquid are separated from each other based on the specific gravities of the cleaning liquid and the metal removal liquid. Thus, the cleaning liquid and the metal removal liquid can be collected completely separately. In this case, it is not necessary for the user to perform an operation of separating the cleaning liquid and the metal removal liquid. Thus, the cost for collecting and discarding each liquid can be lowered.

(2-2) Development Processing Units and Cleaning Drying Processing Units

As shown in FIG. 2, similarly to the coating processing units 129, each development processing unit 139 includes a plurality of spin chucks 35 and a plurality of cups 37. Further, as shown in FIG. 1, the development processing unit 139 includes two slit nozzles 38 that discharge the development liquid and a movement mechanism 39 that moves these slit nozzles 38 in the X direction.

In the development processing unit 139, the spin chuck 35 is rotated by a motor 35a (FIG. 16), described below. Thus, the substrate W is rotated. In this state, the development liquid is supplied to each substrate W while the slit nozzle 38 moves. Thus, the development processing is performed on the substrate W.

A plurality (three in the present example) of cleaning drying processing units BSS are provided in the cleaning drying processing section 161. In each cleaning drying processing unit BSS, the peripheral portion and the back surface of the substrate W that has not been exposed are cleaned with use of an organic solvent or pure water and dried. Here, the back surface refers to a surface on the opposite side of the surface to be processed of the substrate W.

(3) Thermal Processing Sections

Figure 9:
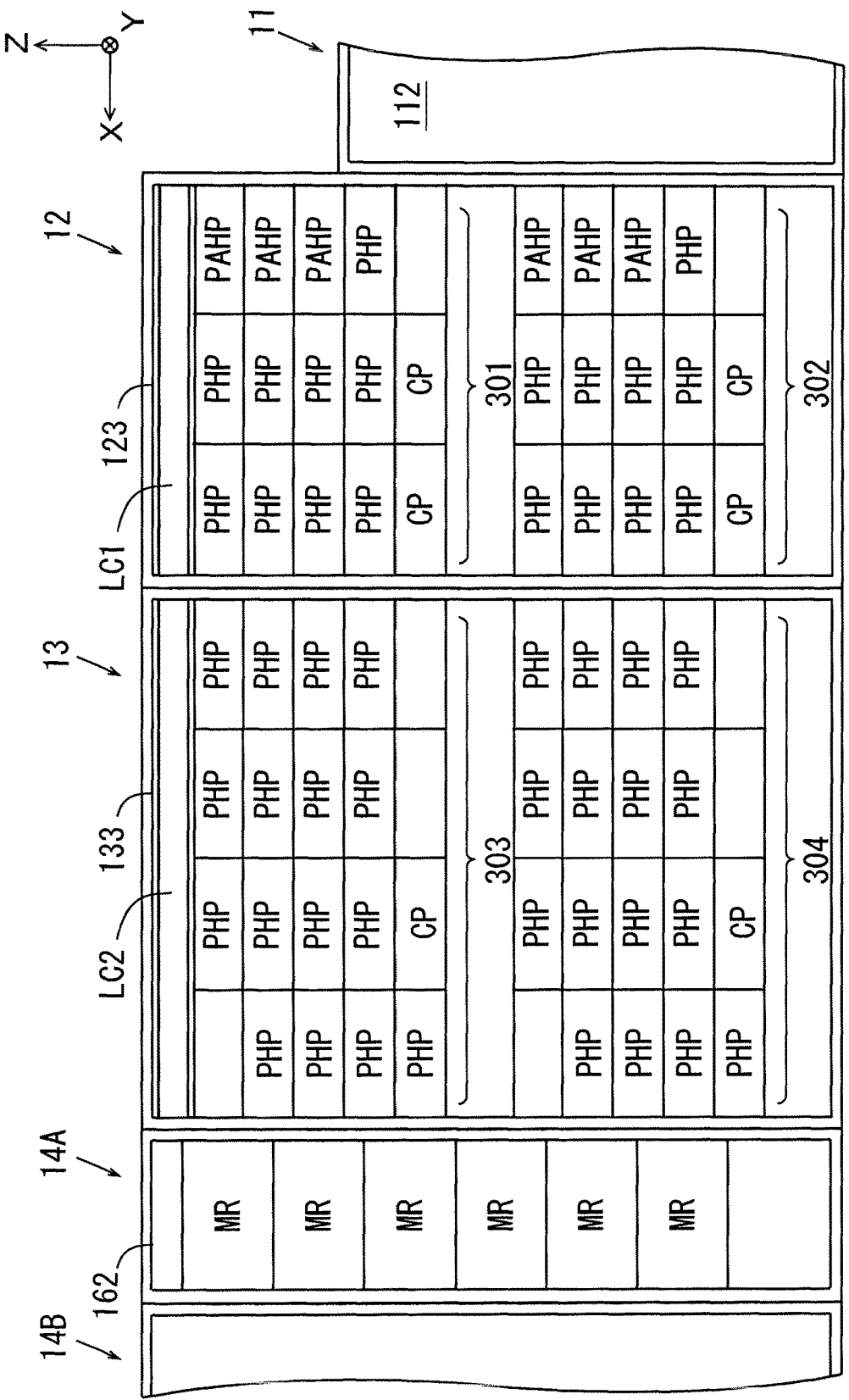
FIG. 9 is a schematic side view showing inner configurations of thermal processing sections and a cleaning drying processing section of FIG. 1.

FIG. 9 is a schematic side view showing inner configurations of the thermal processing sections 123, 133 and the cleaning drying processing section 162 of FIG. 1. As shown in FIG. 9, the thermal processing section 123 has an upper thermal processing section 301 provided above and a lower thermal processing section 302 provided below. A plurality of thermal processing units PHP, a plurality of adhesion reinforcement processing units PAHP and a plurality of cooling units CP are provided in each of the upper thermal processing section 301 and the lower thermal processing section 302.

A local controller LC1 is provided in a top portion of the thermal processing section 123. The local controller LC1 controls operations of the coating processing section 121 (FIG. 1), the transport section 122 (FIG. 1) and the thermal processing section 123 based on instructions from the main controller 114 of FIG. 1.

Heating processing and cooling processing are performed on the substrate W in each thermal processing unit PHP. Adhesion reinforcement processing for improving adhesion between the substrate W and the anti-reflection film is performed in each adhesion reinforcement processing unit PAHP. Specifically, in the adhesion reinforcement processing unit PAHP, an adhesion reinforcement agent such as HMDS (hexamethyldisilazane) is applied to the substrate W, and the heating processing is performed on the substrate W. In each cooling unit CP, cooling processing is performed on the substrate W.

The thermal processing section 133 has an upper thermal processing section 303 provided above and a lower thermal processing section 304 provided below. A cooling unit CP and a plurality of thermal processing units PHP are provided in each of the upper thermal processing section 303 and the lower thermal processing section 304.

A local controller LC2 is provided in a top portion of the thermal processing section 133. The local controller LC2 controls operations of the development processing section 131 (FIG. 1), the transport section 132 (FIG. 1) and the thermal processing section 133 based on instructions from the main controller 114 of FIG. 1.

(4) Metal Removal Units

As described above, with the substrate W rotated by the spin chuck 611 of FIG. 3, the film removal liquid is discharged to the peripheral portion of the substrate W from the edge rinse nozzle 613, whereby the coating liquid that has been applied to the peripheral portion of the substrate W is dissolved. Thus, the metal-containing coating film at the peripheral portion of the substrate W is removed. However, the metallic component contained in the metal-containing coating liquid may remain on the peripheral portion of the substrate W. Further, when the metal-containing coating liquid flows to the back surface of the substrate W, the metallic component contained in the metal-containing coating liquid remains on the back surface of the substrate W.

When the substrate W is transported in the substrate processing apparatus 100 with the metallic component adhering to the peripheral portion or the back surface of the substrate W, the inside of the substrate processing apparatus 100 and the inside of the exposure device 15 are contaminated by the metallic component. As such, the cleaning drying processing section 162 is provided with a plurality (six in the present example) of metal removal units MR for removing the metallic component adhering to the peripheral portion and the back surface of the substrate W that has not been exposed.

In the present example, a metal removal liquid used in three metal removal units MR is different from a metal removal liquid used in the remaining three metal removal units MR. In this case, according to a type of the metallic component contained in the metal-containing coating liquid, the metallic component adhering to the peripheral portion and the back surface of the substrate W can be removed by a suitable metal removal unit MR.

Figure 10:
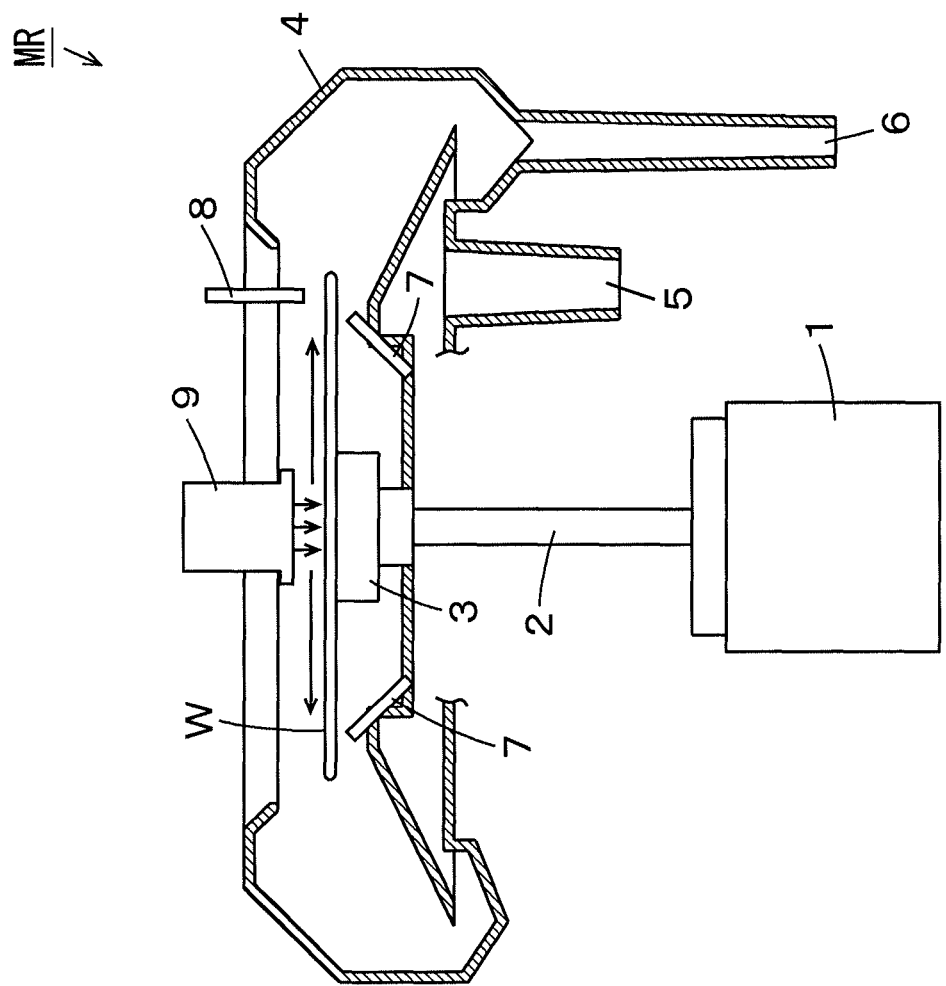
FIG. 10 is a diagram showing a first example of a configuration of a metal removal unit.

FIG. 10 is a diagram showing a first example of a configuration of the metal removal unit MR. As shown in FIG. 10, the metal removal unit MR is provided with a motor 1, a spin chuck 3, a cup 4, two back surface cleaning nozzles 7, a peripheral portion cleaning nozzle 8 and a gas supplier 9. The spin chuck 3 is attached to an upper end of a rotation shaft 2 of the motor 1 to be rotatable about a vertical axis. The cup 4 is arranged to surround the substrate W held by the spin chuck 3. A gas exhaust port 5 and a liquid drainage port 6 are formed in lower portions of the cup 4.

The two back surface cleaning nozzles 7 are arranged to be directed to the back surface of the substrate W held by the spin chuck 3. The metal removal liquid is discharged to the back surface of the substrate W from the back surface cleaning nozzles 7. The peripheral portion cleaning nozzle 8 is arranged to be directed to the peripheral portion of the substrate W held by the spin chuck 3. The metal removal liquid is discharged to the peripheral portion of the substrate W from the peripheral portion cleaning nozzle 8.

The gas supplier 9 is arranged above a substantially center portion of the substrate W held by the spin chuck 3. An inert gas, for example, a nitrogen gas, is ejected to the substantially center portion of the surface to be processed of the substrate W from the gas supplier 9. In this case, the gas ejected from the gas supplier 9 is diffused to the substantially center portion of the surface to be processed of the substrate W. Thus, the metal removal liquid discharged from the peripheral portion cleaning nozzle 8 is prevented from adhering to the coating film formed on the surface to be processed of the substrate W.

Figure 11:
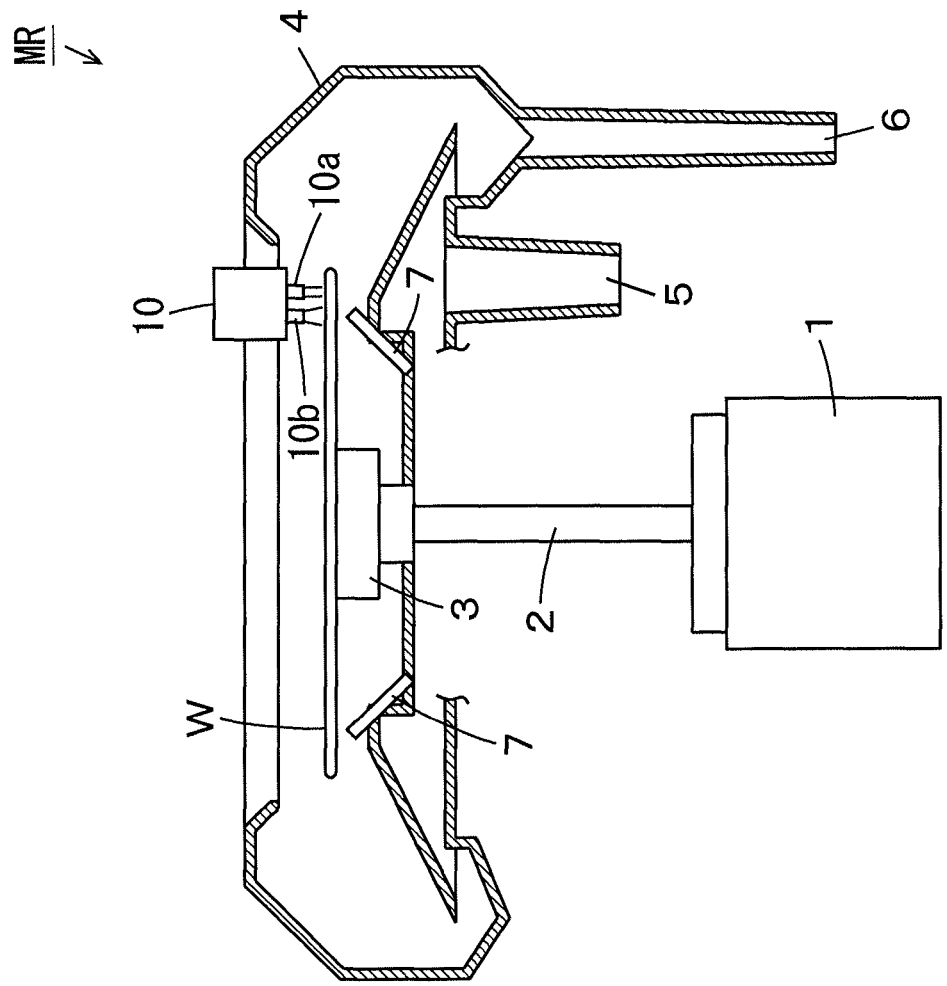
FIG. 11 is a diagram showing a second example of the configuration of the metal removal unit.

FIG. 11 is a diagram showing a second example of the configuration of the metal removal unit MR. As shown in FIG. 11, in the metal removal unit MR in the second example of the configuration, a gas liquid supply nozzle 10 is provided instead of the peripheral portion cleaning nozzle 8 and the gas supplier 9 of FIG. 10. The gas liquid supply nozzle 10 includes a liquid nozzle 10a and a gas nozzle 10b that are arranged in a horizontal direction. The gas liquid supply nozzle 10 is arranged to be directed to the peripheral portion of the substrate W held by the spin chuck 3. Here, the gas nozzle 10b is arranged at a position closer to the center of the substrate W than the liquid nozzle 10a.

The metal removal liquid is discharged to the peripheral portion of the substrate W from the liquid nozzle 10a. An inert gas, for example, a nitrogen gas, is ejected to the peripheral portion of the substrate W from the gas nozzle 10b. In this case, a position of the substrate W to which the gas is ejected from the gas nozzle 10b is closer to the center of the substrate W than the position to which the metal removal liquid is discharged from the liquid nozzle 10a. Therefore, the metal removal liquid discharged from the liquid nozzle 10a is prevented from moving towards the center of the substrate W by the gas ejected from the gas nozzle 10b. Thus, the metal removal liquid discharged from the liquid nozzle 10a is prevented from adhering to the coating film formed on the surface to be processed of the substrate W.

In the metal removal unit MR of FIGS. 10 and 11, because the metal removal liquid is supplied to the peripheral portion of the substrate W from the peripheral portion cleaning nozzle 8 or the liquid nozzle 10a, the metallic component in the metal-containing coating film at the peripheral portion of the substrate W is dissolved, and the metal-containing coating film remains in a region except for the peripheral portion of the surface to be processed of the substrate W. Further, because the metal removal liquid is supplied to the back surface of the substrate W from the back surface cleaning nozzle 7, even when the metal-containing coating liquid flows to the back surface of the substrate W, the metallic component in the metal-containing coating liquid adhering to the back surface of the substrate is removed.

Further, in the present example, because the substrate W of which the metal-containing coating film has been cured by the thermal processing section 123 is transported to the metal removal unit MR, even when the gas is discharged to the substrate W from the gas supplier 9 or the gas nozzle 10b in the metal removal unit MR, the film thickness of the metal-containing coating film is not affected. As a result, the metal-containing coating film having a uniform thickness can be formed on the surface to be processed of the substrate W.

(5) Transport Sections

Figure 12:
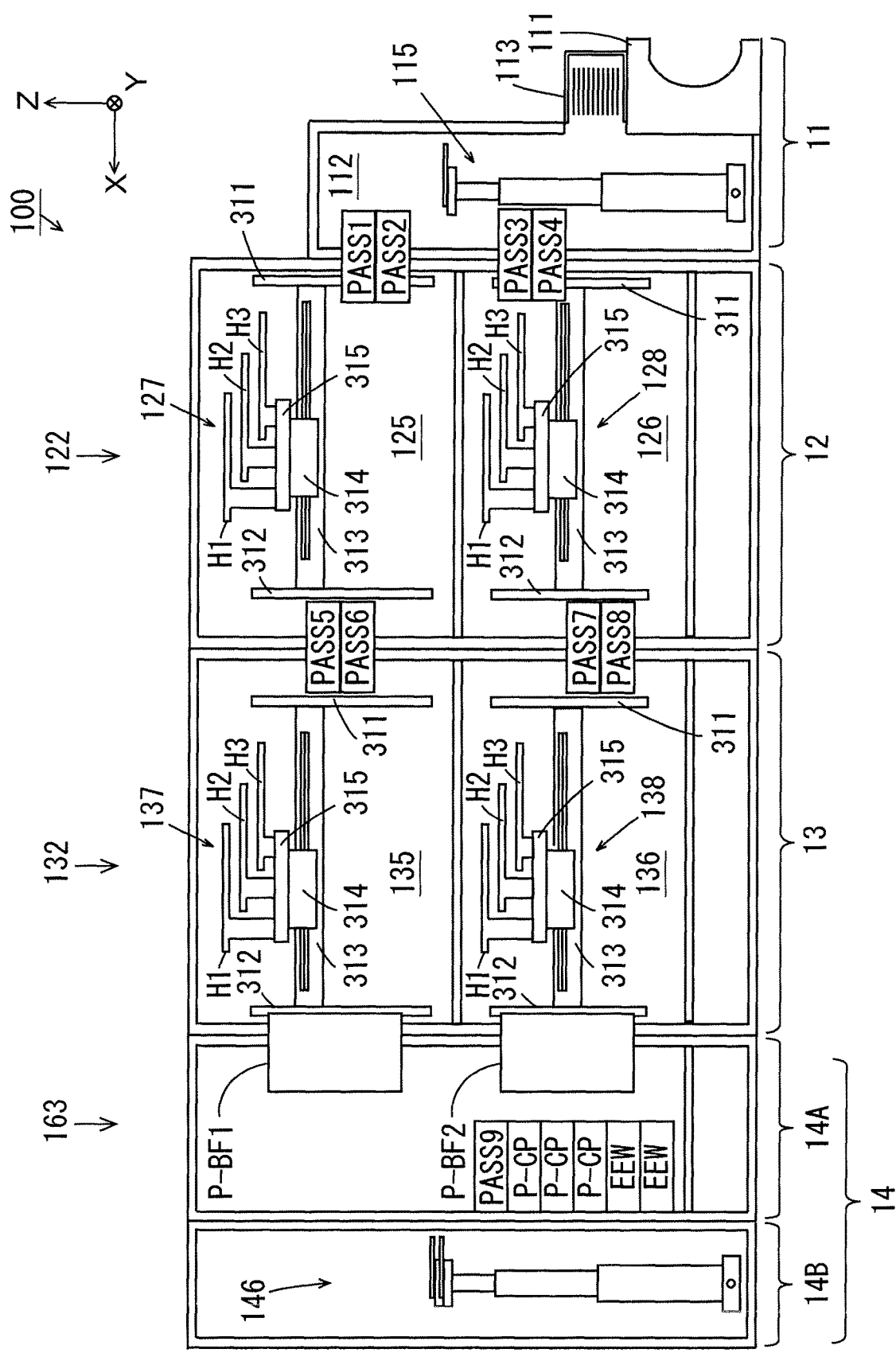
FIG. 12 is a schematic side view showing an inner configuration of transport sections.

FIG. 12 is a schematic side view showing inner configurations of the transport sections 122, 132, 163. As shown in FIG. 12, the transport section 122 has an upper transport chamber 125 and a lower transport chamber 126. The transport section 132 has an upper transport chamber 135 and a lower transport chamber 136. The upper transport chamber 125 is provided with a transport mechanism 127, and the lower transport chamber 126 is provided with a transport mechanism 128. Further, the upper transport chamber 135 is provided with a transport mechanism 137, and the lower transport chamber 136 is provided with a transport mechanism 138.

The upper thermal processing section 301 (FIG. 9) is opposite to the coating processing chambers 21, 22 (FIG. 2) with the upper transport chamber 125 interposed therebetween. The lower thermal processing section 302 (FIG. 9) is opposite to the coating processing chambers 23, 24 (FIG. 2) with the lower transport chamber 126 interposed therebetween. Similarly, the upper thermal processing section 303 (FIG. 9) is opposite to the development processing chambers 31, 32 (FIG. 2) with the upper transport chamber 135 interposed therebetween. The lower thermal processing section 304 (FIG. 9) is opposite to the development processing chambers 33, 34 (FIG. 2) with the lower transport chamber 136 interposed therebetween.

The substrate platforms PASS1, PASS2 are provided between the transport section 112 and the upper transport chamber 125, and the substrate platforms PASS3, PASS4 are provided between the transport section 112 and the lower transport chamber 126. The substrate platforms PASS5, PASS6 are provided between the upper transport chamber 125 and the upper transport chamber 135, and the substrate platforms PASS7, PASS8 are provided between the lower transport chamber 126 and the lower transport chamber 136.

The placement buffer unit P-BF1 is provided between the upper transport chamber 135 and the transport section 163, and the placement buffer unit P-BF2 is provided between the lower transport chamber 136 and the transport section 163. The substrate platform PASS9, the plurality of edge exposure units EEW and the plurality of placement cooling units P-CP are provided in the transport section 163 to be adjacent to the carry-in carry-out block 14B.

The placement buffer unit P-BF1 is configured to be capable of carrying in and carrying out the substrate W by the transport mechanism 137 and the transport mechanisms 141, 142 (FIG. 1). The placement buffer unit P-BF2 is configured to be capable of carrying in and carrying out the substrate W by the transport mechanism 138 and the transport mechanisms 141, 142 (FIG. 1). Further, the substrate platform PASS9, the edge exposure units EEW and the placement cooling units P-CP are configured to be capable of carrying in and carrying out the substrates W by the transport mechanisms 141, 142 (FIG. 1) and the transport mechanism 146.

In each edge exposure unit EEW, exposure processing (edge exposure processing) is performed on the peripheral portion of the substrate W. The edge exposure processing is performed on the substrate W, so that a resist film on the peripheral portion of the substrate W is removed during the subsequent development processing. Thus, when the peripheral portion of the substrate W comes into contact with another member after the development processing, the resist film on the peripheral portion of the substrate W is prevented from being stripped and becoming particles.

The substrates W to be transported from the indexer block 11 to the first processing block 12 are placed on the substrate platform PASS1 and the substrate platform PASS3. The substrates W to be transported from the first processing block 12 to the indexer block 11 are placed on the substrate platform PASS2 and the substrate platform PASS4.

The substrates W to be transported from the first processing block 12 to the second processing block 13 are placed on the substrate platform PASS5 and the substrate platform PASS7. The substrates W to be transported from the second processing block 13 to the first processing block 12 are placed on the substrate platform PASS6 and the substrate platform PASS8.

The substrates W to be transported from the second processing block 13 to the cleaning drying processing block 14A are placed on the placement buffer units P-BF1, P-BF2. The substrates W to be transported from the cleaning drying processing block 14A to the carry-in carry-out block 14B are placed on the placement cooling units P-CP. The substrates W to be transported from the carry-in carry-out block 14B to the cleaning drying processing block 14A are placed on the substrate platform PASS9.

Figure 13:
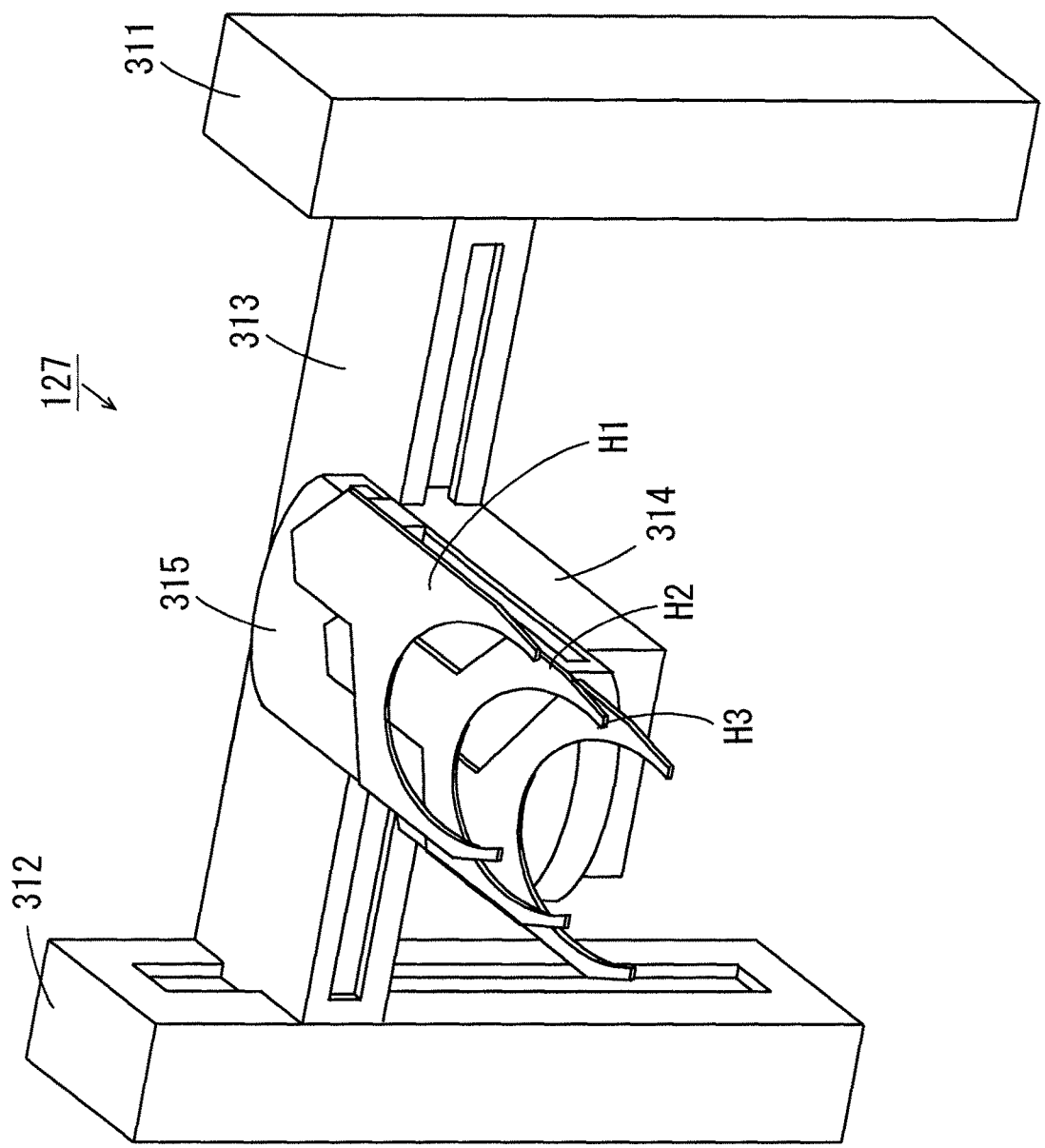
FIG. 13 is a perspective view showing a transport mechanism.

Next, the transport mechanism 127 will be described. FIG. 13 is a perspective view showing the transport mechanism 127. As shown in FIGS. 12 and 13, the transport mechanism 127 includes elongated guide rails 311, 312. As shown in FIG. 12, the guide rail 311 is fixed to the side surface close to the transport section 112 to extend in the vertical direction in the upper transport chamber 125. The guide rail 312 is fixed to the side surface close to the upper transport chamber 135 to extend in the vertical direction in the upper transport chamber 125.

An elongated guide rail 313 is provided between the guide rail 311 and the guide rail 312. The guide rail 313 is attached to the guide rails 311, 312 to be movable in the vertical direction. A moving member 314 is attached to the guide rail 313. The moving member 314 is provided to be movable in a longitudinal direction of the guide rail 313.

An elongated rotation member 315 is rotatably provided on an upper surface of the moving member 314. Hands H1, H2, H3 for holding outer peripheries of the substrates W are attached to the rotation member 315. The hands H1 to H3 are provided to be movable in a longitudinal direction of the rotation member 315. The hand H1 is arranged at a position farther upward than the hand H2, and the hand H2 is arranged at a position farther upward than the hand H3.

The above-mentioned configuration enables the transport mechanism 127 to move in the X and Z directions in the upper transport chamber 125. The transport mechanism 127 can receive the substrates W from and transfer the substrates W to the coating processing chambers 21, 22 (FIG. 2), the substrate platforms PASS1, PASS2, PASS5, PASS6 (FIG. 12) and the upper thermal processing section 301 (FIG. 9) using the hands H1 to H3.

As shown in FIG. 12, the transport mechanisms 128, 137, 138 have the configuration similar to that of the transport mechanism 127. Further, in the present embodiment, the transport mechanism 142 of FIG. 1 has the three hands H1 to H3 similar to those of the transport mechanism 127.

(6) Substrate Processing

The substrate processing will be described with reference to FIGS. 1, 2, 9 and 12. Each carrier 113 in which unprocessed substrates W are stored is placed on each carrier platform 111 (FIG. 1) in the indexer block 11. The transport mechanism 115 transports the unprocessed substrate W from the carrier 113 to each of the substrate platforms PASS1, PASS3 (FIG. 12). Further, the transport mechanism 115 transports the processed substrate W that is placed on each of the substrate platforms PASS2, PASS4 (FIG. 12) to the carrier 113.

In the first processing block 12, the transport mechanism 127 (FIG. 12) sequentially transports the unprocessed substrate W that is placed on the substrate platform PASS1 to the adhesion reinforcement processing unit PAHP (FIG. 9), the cooling unit CP (FIG. 9) and the coating processing chamber 22 (FIG. 2) using the middle hand H2 and the lower hand H3. Next, the transport mechanism 127 sequentially transports the substrate W in the coating processing chamber 22 to the thermal processing unit PHP (FIG. 9), the cooling unit CP (FIG. 9), the coating processing chamber 21 (FIG. 2), the thermal processing unit PHP (FIG. 9) and the substrate platform PASS5 (FIG. 12) using the hands H2, H3.

In this case, the adhesion reinforcement processing is performed on the substrate W in the adhesion reinforcement processing unit PAHP, and then the substrate W is cooled in the cooling unit CP to a temperature suitable for the formation of the anti-reflection film. Next, an anti-reflection film is formed on the substrate W by the coating processing unit 129 (FIG. 2) in the coating processing chamber 22. Subsequently, the thermal processing is performed on the substrate W in the thermal processing unit PHP, and then the substrate W is cooled in the cooling unit CP to a temperature suitable for the formation of the resist film. Then, a resist film is formed on the substrate W by the coating processing unit 129 (FIG. 2) in the coating processing chamber 21. Thereafter, the thermal processing is performed on the substrate W in the thermal processing unit PHP, and the substrate W is placed on the substrate platform PASS5.

Further, the transport mechanism 127 transports the substrate W on which the development processing has been performed and which is placed on the substrate platform PASS6 (FIG. 12) to the substrate platform PASS2 (FIG. 12) using the upper hand H1.

The transport mechanism 128 (FIG. 12) sequentially transports the unprocessed substrate W that is placed on the substrate platform PASS3 to the adhesion reinforcement processing unit PAHP (FIG. 9), the cooling unit CP (FIG. 9), and the coating processing chamber 24 (FIG. 2) using the middle hand H2 and the lower hand H3. Next, the transport mechanism 128 sequentially transports the substrate W in the coating processing chamber 24 to the thermal processing unit PHP (FIG. 9), the cooling unit CP (FIG. 9), the coating processing chamber 23 (FIG. 2), the thermal processing unit PHP (FIG. 9) and the substrate platform PASS7 (FIG. 12) using the hands H2, H3.

Further, the transport mechanism 128 (FIG. 12) transports the substrate W on which the development processing has been performed and which is placed on the substrate platform PASS8 (FIG. 12) to the substrate platform PASS4 (FIG. 12) using the upper hand H1. The contents of processing for the substrate W in the coating processing chambers 23, 24 (FIG. 2) and the lower thermal processing section 302 (FIG. 9) are respectively similar to the contents of processing for the substrate W in the above-mentioned coating processing chambers 21, 22 (FIG. 2) and the upper thermal processing section 301 (FIG. 9).

In the second processing block 13, the transport mechanism 137 (FIG. 12) transports the substrate W on which the resist film is formed and which is placed on the substrate platform PASS5 to the placement buffer unit P-BF1 (FIG. 12) using the lower hand H3.

Further, the transport mechanism 137 (FIG. 12) takes out the substrate W that has been exposed and thermally processed from the thermal processing unit PHP (FIG. 9) adjacent to the cleaning drying processing block 14A using the upper hand H1 and the middle hand H2. The transport mechanism 137 sequentially transports the substrate W to the cooling unit CP (FIG. 9), one of the development processing chambers 31, 32 (FIG. 2), the thermal processing unit PHP (FIG. 9) and the substrate platform PASS6 (FIG. 12) using the hands H1, H2.

In this case, the substrate W is cooled in the cooling unit CP to a temperature suitable for the development processing, and then the development processing is performed on the substrate W by the development processing unit 139 in one of the development processing chambers 31, 32. Thereafter, the thermal processing is performed on the substrate W in the thermal processing unit PHP, and the substrate W is placed on the substrate platform PASS6.

The transport mechanism 138 (FIG. 12) transports the substrate W on which the resist film is formed and which is placed on the substrate platform PASS7 to the placement buffer unit P-BF2 (FIG. 12) using the lower hand H3.

Further, the transport mechanism 138 (FIG. 12) takes out the substrate W which has been exposed and thermally processed from the thermal processing unit PHP (FIG. 9) adjacent to the interface block 14 using the upper hand H1 and the middle hand H2. The transport mechanism 138 sequentially transports the substrate W to the cooling unit CP (FIG. 9), one of the development processing chambers 33, 34 (FIG. 2), the thermal processing unit PHP (FIG. 9) and the substrate platform PASS8 (FIG. 12) using the hands H1, H2. The contents of processing for the substrate W in the development processing chambers 33, 34 and the lower thermal processing section 304 are respectively similar to the contents of processing for the substrate W in the above-mentioned development processing chambers 31, 32 and the upper thermal processing section 303.

In the cleaning drying processing block 14A, the transport mechanism 142 (FIG. 1) transports the substrate W that is placed on the placement buffer unit P-BF1, P-BF2 (FIG. 12) to the metal removal unit MR (FIG. 9) using the lower hand H3. Further, the transport mechanism 142 transports the substrate W in the metal removal unit MR to the placement buffer unit P-BF1 (FIG. 12) or the placement buffer unit P-BF2 (FIG. 12) using the upper hand H1 and the middle hand H2. The transport mechanism 141 (FIG. 1) sequentially transports the substrate W that has been transported from the metal removal unit MR to the placement buffer unit P-BF1, P-BF2 to the cleaning drying processing unit BSS (FIG. 2), the edge exposure unit EEW and the placement cooling unit P-CP (FIG. 12).

In this case, in the metal removal unit MR, the metallic component remaining on the peripheral portion and the back surface of the substrate W is removed. Further, in the cleaning drying processing unit BSS, the peripheral portion and the back surface of the substrate W are cleaned and dried. Subsequently, the edge exposure processing is performed on the substrate W in the edge exposure unit EEW. After that, the substrate W is cooled in the placement cooling unit P-CP to a temperature suitable for the exposure processing by the exposure device 15 (FIG. 1).

Further, the transport mechanism 142 (FIG. 1) sequentially transports the substrate W that is placed on the substrate platform PASS9 (FIG. 12) and has been exposed to a thermal processing unit PHP (FIG. 9) in the upper thermal processing section 303 or the lower thermal processing section 304. In this case, post-exposure bake (PEB) processing is performed in the thermal processing unit PHP.

In the carry-in carry-out block 14B, the transport mechanism 146 (FIG. 1) transports the substrate W that is placed on the placement cooling unit P-CP (FIG. 12) and has not been exposed to a substrate inlet of the exposure device 15 (FIG. 1). Further, the transport mechanism 146 takes out the substrate W that has been exposed from a substrate outlet of the exposure device 15, and transports the substrate W to the substrate platform PASS9 (FIG. 12). In the exposure device 15, the exposure processing is performed on the substrate by EUV having a significantly short wavelength. In this case, the metallic component is contained in the coating film on the substrate W, so that EUV light is efficiently absorbed. Thus, a fine exposure pattern can be formed at high resolution. The exposure method is not limited to this, and the exposure processing may be performed on the substrate W with use of another method.

In the above-mentioned transportation of the substrate W, the substrate W from which the metallic component has not been removed and the substrate W from which the metallic component has been removed are held by different hands of the transport mechanisms 127, 128, 137, 138, 142. Thus, the metallic component is prevented from adhering to the substrate W, from which the metallic component has been removed, via the hands of the transport mechanisms 127, 128, 137, 138, 142. Thus, metal contamination via the transport mechanisms is prevented from spreading.

(7) Effects

In the substrate processing apparatus 100 according to the present embodiment, the cleaning liquid and the metal removal liquid are supplied to the cup 612 of the coating processing unit 129, so that the cleaning processing is performed on the cup 612. Thus, the coating liquid and its solidified matter adhering to the cup 612 are removed, and the metallic component remaining on the cup 612 is removed. Therefore, the metallic component is prevented from being diffused from the cup 612. As a result, the substrate W, the inside of the substrate processing apparatus 100 and the inside of the exposure device 15 are prevented from being contaminated by the metal.

(8) Another Example of Cup Cleaning Mechanism

Figure 14:
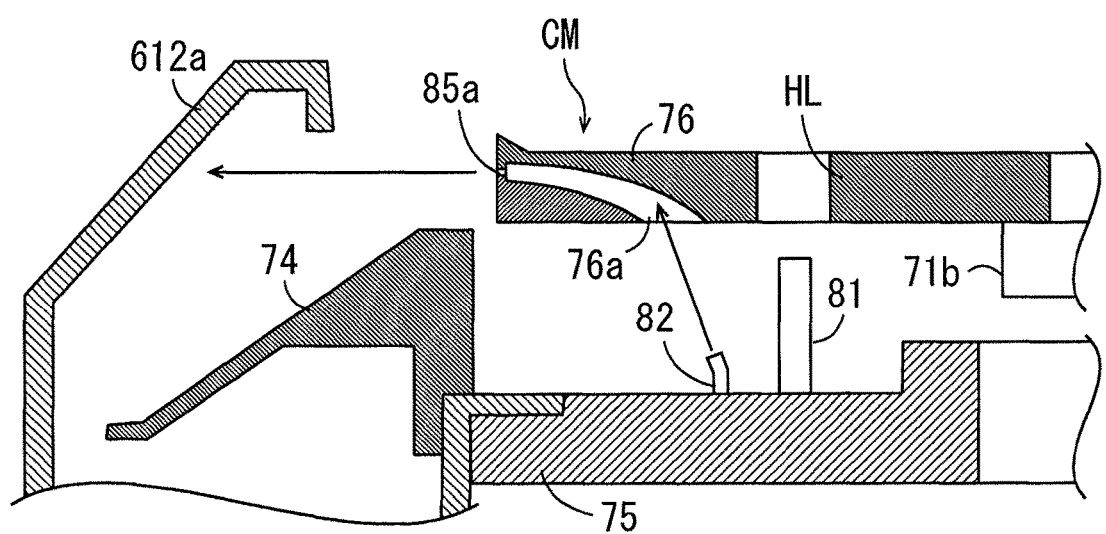
FIG. 14 is a diagram for explaining another example of a cup cleaning mechanism.

FIG. 14 is a diagram for explaining another example of the cup cleaning mechanism CM. As for the example of FIG. 14, differences from the example of FIG. 4 will be described.

A cup cleaning mechanism CM of FIG. 14 includes only the cup cleaning nozzle 82 out of the cup cleaning nozzles 82, 83 of FIG. 4. Further, only the first guide 76a out of the first and second guides 76a, 76b of FIG. 4 is provided in a cup cleaning member 76. A cleaning liquid and a metal removal liquid are selectively supplied to the cup cleaning nozzle 82 from a cleaning liquid supply source (not shown) and a metal removal liquid supply source (not shown). In this case, the cleaning liquid and the metal removal liquid are respectively discharged from the cup cleaning nozzle 82 to the first guide 76a of the cup cleaning member 76. Thus, the cleaning liquid and the metal removal liquid are respectively discharged from a plurality of common discharge ports 85a to an outer cup 612a.

Also in the present example, the cleaning liquid is discharged to the outer cup 612a, so that a coating liquid, its solidified matter and the like adhering to the outer cup 612a are removed. Further, the metal removal liquid is discharged to the outer cup 612a, so that the metallic component remaining on the outer cup 612a is removed. Further, the cleaning liquid is discharged to the outer cup 612a again, so that the metal removal liquid adhering to the outer cup 612a is cleaned away. Thus, the outer cup 612a can be cleaned. Further, as compared to the example of FIG. 4, a configuration of the cup cleaning mechanism CM is simplified.

During the cleaning processing for the outer cup 612a, the outer cup 612a may be lifted and lowered by the lifting lowering mechanism 72 of FIG. 4. For example, in a period during which the cleaning liquid is discharged, the outer cup 612a is maintained at a first height. In a period during which the metal removal liquid is discharged, the outer cup 612a may be maintained at a second height that is higher than the first height. In this case, on an inner peripheral surface of the outer cup 612a, a region to which the cleaning liquid is supplied is larger than a region to which the metal removal liquid is supplied. Thus, the metal removal liquid is sufficiently cleaned away by the cleaning liquid, and the metal removal liquid is prevented from remaining on the outer cup 612a.

Further, as described above, the metal removal liquid is supplied to the outer cup 612a, and then pure water may be supplied instead of the cleaning liquid. Further, the metal removal liquid may be supplied to the outer cup 612a first, and the cleaning liquid may be subsequently supplied to the outer cup 612a. Further, the plurality of types of metal removal liquids may be used. Further, in order to collect the cleaning liquid and the metal removal liquid, the collection unit 61A of FIG. 4 may be used. Alternatively, the collection unit 61A of FIG. 8 may be used. Further, the cleaning liquid and the metal removal liquid may be supplied to a straightening member 74 of an inner cup 611b in addition to the outer cup 612a.

Alternatively, the metal removal liquid having a property of dissolving the coating liquid may be supplied to a cup cleaning nozzle 83. In this case, the metal removal liquid is supplied to the cup 612, so that the coating liquid and a solidified matter are removed from the cup 612, and the metallic component is removed simultaneously. Thus, the cup 612 can be efficiently cleaned with a simple configuration.

(9) Another Example of Spin Units

Figure 15:
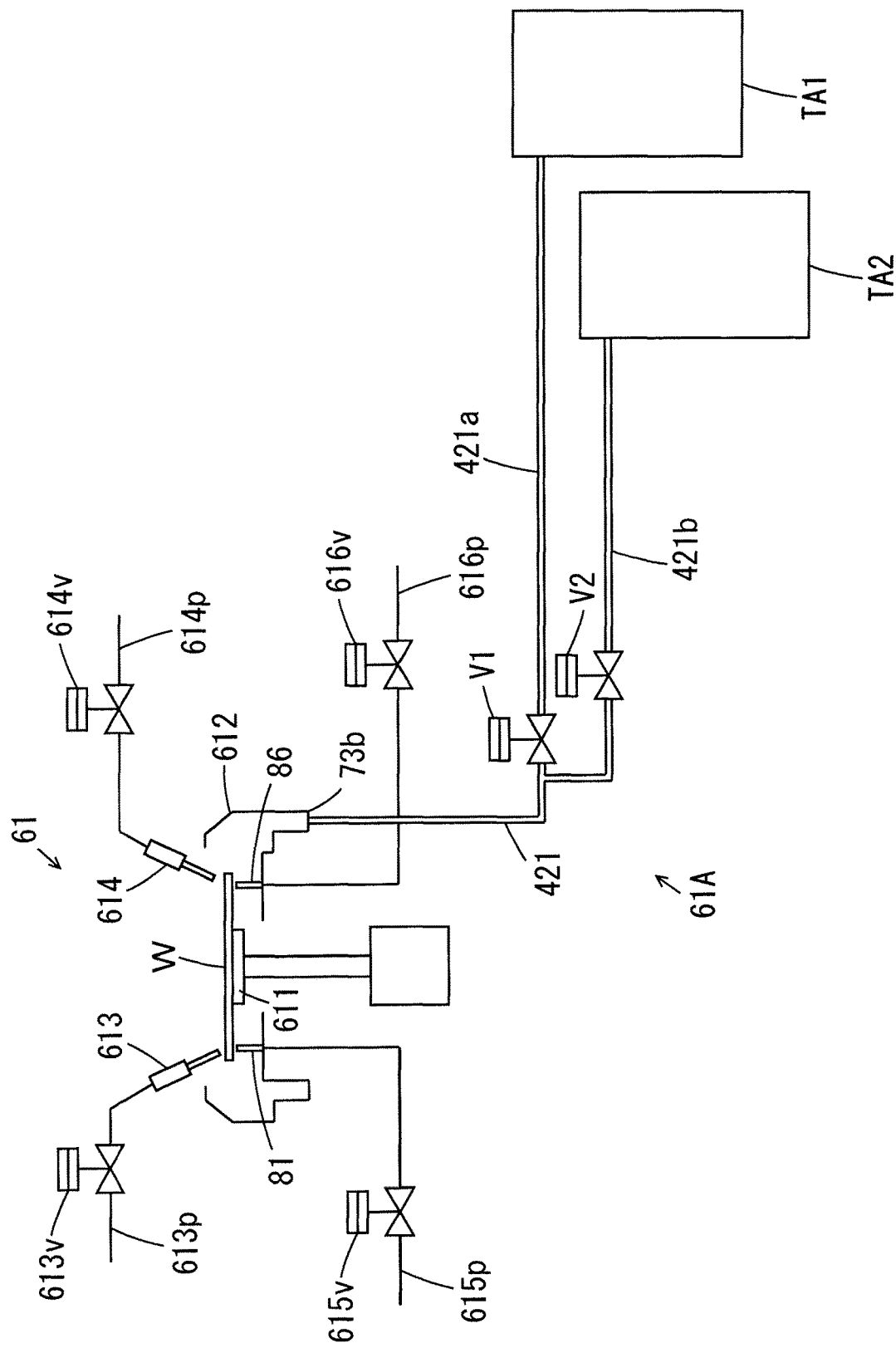
FIG. 15 is a schematic side view for explaining another example of a spin unit.

FIG. 15 is a schematic side view for explaining another example of a spin unit 61. As for the spin unit 61 of FIG. 15, differences from the spin unit 61 of FIG. 4 will be described.

In addition to the configuration of FIG. 4, the spin unit 61 of FIG. 15 further includes an edge rinse nozzle 614 and a back rinse nozzle 86. Similarly to the edge rinse nozzle 613, the edge rinse nozzle 614 is arranged to be directed to a peripheral portion of a surface to be processed of a substrate W held by a spin chuck 611. Similarly to a back rinse nozzle 81, the back rinse nozzle 86 is arranged to be directed to a back surface of the substrate W held by the spin chuck 611.

Supply pipes 613p, 614p are connected to the edge rinse nozzles 613, 614, respectively. Supply valves 613v, 614v are provided at the supply pipes 613p, 614p, respectively. Supply pipes 615p, 616p are connected to the back rinse nozzles 81, 86, respectively. Supply valves 615v, 616v are provided at the supply pipes 615p, 616p, respectively.

The film removal liquid and the cleaning liquid, described above, are supplied to the edge rinse nozzle 613 and the back rinse nozzle 81 through the supply pipes 613p, 615p, respectively, and a metal removal liquid is supplied to the edge rinse nozzle 614 and the back rinse nozzle 86 through the supply pipes 614p, 616p.

A metal-containing coating film is formed on the substrate W. After that, with the substrate W rotated by the spin chuck 611, the film removal liquid is discharged from the edge rinse nozzle 613 to the peripheral portion of the substrate W, and the cleaning liquid is discharged to the back surface of the substrate W from the back rinse nozzle 81. In this case, the coating liquid that has been applied to the peripheral portion and the back surface of the substrate W is dissolved and removed.

Thereafter, with the substrate W rotated by the spin chuck 611, the metal removal liquid is discharged to the peripheral portion of the substrate W from the edge rinse nozzle 614, and the metal removal liquid is discharged to the back surface of the substrate W from the back rinse nozzle 86. In this case, the metallic component remaining on the peripheral portion and the back surface of the substrate W is dissolved and removed.

In a period during which the film removal liquid and the cleaning liquid are discharged from the edge rinse nozzle 613 and the back rinse nozzle 81, respectively, a collection valve V1 is opened, and a collection valve V2 is closed. Thus, the film removal liquid and the cleaning liquid drained from a liquid drainage port 73b are guided to a collection tank TA1. On the other hand, in a period during which the metal removal liquid is discharged from the edge rinse nozzle 614 and the back rinse nozzle 86, the collection valve V1 is closed, and the collection valve V2 is opened. Thus, the metal removal liquid drained from the liquid drainage port 73b is guided to a collection tank TA2.

In this manner, in the spin unit 61 of FIG. 15, the metal-containing coating film is formed on the substrate W, and the coating liquid and the metallic component are removed from the peripheral portion and the back surface of the substrate W. Therefore, it is not necessary to transport the substrate W to the metal removal unit MR. Therefore, a time period required to transport the substrate W can be shortened, and a throughput can be increased. Further, because the metal removal unit MR does not have to be provided, the size of the substrate processing apparatus 100 can be reduced, and the cost of the apparatus can be lowered.

Further, similarly to the time of the cleaning processing for the cup 612, the used film removal liquid and the used cleaning liquid are collected separately from the used metal removal liquid. Thus, it is not necessary for the user to carry out an operation of separating the film removal liquid and the cleaning liquid from the metal removal liquid. Therefore, the cost for collecting and discarding the removal liquid can be lowered.

While the edge rinse nozzle 613 for discharging the film removal liquid and the edge rinse nozzle 615 for discharging the metal removal liquid are separately provided in the present example, a common edge rinse nozzle for selectively discharging the film removal liquid and the metal removal liquid may be provided. Similarly, a common back rinse nozzle for selectively discharging the cleaning liquid and the metal removal liquid may be provided. Alternatively, the metal removal liquid may have a property of dissolving the coating liquid. In this case, the edge rinse nozzle 613 and the back rinse nozzle 81 do not have to be provided.

While the collection unit 61A of FIG. 4 is provided in the spin unit 61 of FIG. 15, the collection unit 61A of FIG. 8 may be provided instead of this. Further, two types of removal liquids may be separately collected with another configuration. For example, the cup 612 may be a two-layer cup that can separately collect two types of removal liquids.

(10) Other Embodiments (10-1)

Figure 16:
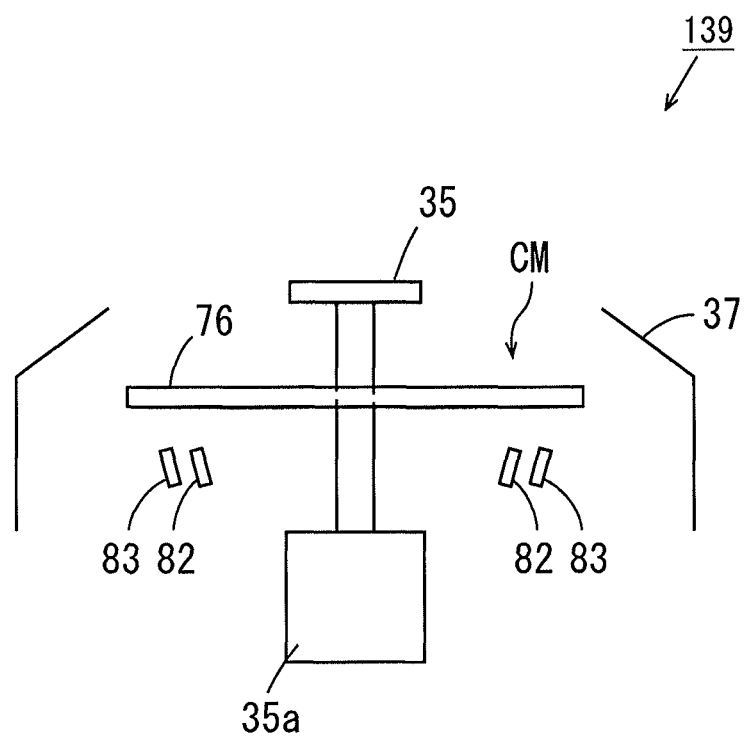
FIG. 16 is a schematic side view showing one example of a development processing unit.

While the cup cleaning mechanism CM is provided in each coating processing unit 129 in the above-mentioned embodiment, the present invention is not limited to this. The cup cleaning mechanism CM may be provided in each development processing unit 139. FIG. 16 is a schematic side view showing one example of a development processing unit 139. In addition to the spin chucks 35 and the cups 37 of FIG. 2, the development processing unit 139 of FIG. 16 includes a cup cleaning member 76 and cup cleaning nozzles 82, 83. The cup cleaning mechanism CM of FIG. 16 has the configuration similar to that of the cup cleaning mechanism CM of FIG. 4. Thus, a cleaning liquid and a metal removal liquid are respectively supplied to the cup 37.

In the development processing unit 139, a development liquid is supplied to a surface to be processed of a substrate W from the slit nozzle 38 of FIG. 1, whereby part of a metal-containing coating film on which the exposure processing has been performed is dissolved. Thereafter, a rinse liquid is supplied onto the substrate W from a rinse nozzle (not shown) while the substrate W is rotated by the spin chuck 35. Thus, the development liquid on the substrate W is cleaned away. In this case, the development liquid and the dissolved metal-containing coating film on the substrate W are splashed to an area farther outward than the substrate W together with the rinse liquid and received by the cup 37. Therefore, a coating liquid and a metallic component adhere to the cup 37.

As such, in the development processing unit 139 of FIG. 16, the cleaning liquid and the metal removal liquid are respectively supplied to the cup 37, whereby the coating liquid and the metallic component adhering to the cup 37 are removed. As a result, the metal is prevented from being diffused from the cup 37.

Further, the collection unit 61A of FIG. 4 or 8 may be provided in the development processing unit 139. Thus, the cleaning liquid and the metal removal liquid supplied to the cup 37 can be separately collected.

(10-2)

While the cleaning liquid and the metal removal liquid that have been discharged from the cup cleaning nozzles 82, 83 are guided to the outer cup 612a through the first and second guides 76a, 76b of the cup cleaning member 76 in the above-mentioned embodiment, the present invention is not limited to this. For example, cup cleaning nozzles 82, 83 may be provided to discharge a cleaning liquid and a metal removal liquid to an outer cup 612a. Further, one of the cup cleaning nozzles 82, 83 may supply one of the cleaning liquid and the metal removal liquid to the outer cup 612a directly, and the other one of the cup cleaning nozzles 82, 83 may supply the other one of the cleaning liquid and the metal removal liquid to the outer cup 612a through a cup cleaning member 76. Further, the cup cleaning nozzle 82 does not have to be provided, and the cleaning liquid and its solidified matter may be removed by a brush or the like.

(10-3)

While the metallic component is contained in both of the anti-reflection liquid and the resist liquid in the above-mentioned embodiment, the present invention is not limited to this. The metallic component does not have to be contained in one of the anti-reflection liquid and the resist liquid. A metallic component may be contained in a coating liquid for forming another film such as a hardmask film (HM). In this case, titanium oxide ($TiO_x$), tungsten oxide ($WO_x$) or zirconium oxide ($ZrO_x$), for example, is contained in the coating liquid as the metallic component.

(10-4)

While the hands H1 to H3 of the transport mechanisms 127, 128, 137, 138, 141 hold the outer peripheries of the substrates W in the above-mentioned embodiment, the present invention is not limited to this. The hands H1 to H3 of the transport mechanisms 127, 128, 137, 138, 141 may hold the back surfaces of the substrates W by sucking the substrates W.

(10-5)

While the transport mechanisms 127, 128, 137, 138, 141 preferably have the three hands H1 to H3 in the above-mentioned embodiment, the present invention is not limited to this. The transport mechanisms 127, 128, 137, 138, 141 may have two hands or less or may have four hands or more.

(10-6)

In the above-mentioned embodiment, the plurality of cleaning drying processing units BSS are arranged in the cleaning drying processing section 161, and the plurality of metal removal units MR are arranged in the cleaning drying processing section 162. However, the present invention is not limited to this. Part or all of the cleaning drying processing units BSS may be arranged in the cleaning drying processing section 162. Part or all of the metal removal units MR may be arranged in the cleaning drying processing section 161.

(10-7)

While the edge rinse nozzle 613 is provided in each coating processing unit 129 in the above-mentioned embodiment, the present invention is not limited to this. For example, the edge rinse nozzle 613 does not have to be provided in each coating processing unit 129, and the edge rinse nozzle 613 may be provided in each metal removal unit MR. In this case, the film removal liquid and the metal removal liquid are supplied to the peripheral portion of the substrate W in the metal removal unit MR. In order to collect a used film removal liquid and a used metal removal liquid, a collection unit similar to the example of FIG. 4 or 8 may be provided in the metal removal unit MR.

(10-8)

While the edge exposure units EEW are provided in the interface block 14 in the above-mentioned embodiment, the present invention is not limited to this. The edge exposure units EEW do not have to be provided in the interface block 14, and may be provided in the upper thermal processing section 301 and the lower thermal processing section 302 of the first processing block 12. In this case, a resist film is formed, and then the edge exposure processing is performed on a substrate W before the substrate W is placed on substrate platform PASS5, PASS7.

(10-9)

The metal removal units MR may be provided in other places. For example, the metal removal units MR may be provided in the first or second processing block 12, 13. Further, the metal removal liquid may be supplied to the peripheral portion and the back surface of the substrate W in the development processing unit 139 to remove a metallic component from the peripheral portion and the back surface of the substrate W. Further, another processing block including the metal removal units MR may be arranged between the first processing block 12 and the second processing block 13.

(11) Correspondences Between Constituent Elements in Claims and Parts in Preferred Embodiments In the following paragraphs, non-limiting examples of correspondences between various elements recited in the claims below and those described above with respect to various preferred embodiments of the present invention are explained.

In the above-mentioned embodiments, the coating processing unit 129 or the development processing unit 139 is an example of a film processing unit, the spin chuck 611 or the spin chuck 35 is an example of the rotation holder, the nozzle 620 or the slit nozzle 38 is an example of a processing liquid supplier. The cup 612 or the cup 37 is an example of a splash prevention member, and the cup cleaning nozzle 83 is an example of a removal liquid supplier. Further, the cup cleaning member 76 is an example of a guide member, the second guide 76b is an example of a first removal liquid guide, the first guide 76a is an example of a second removal liquid guide, the cup cleaning nozzle 83 is an example of a first discharge nozzle, the cup cleaning nozzle 82 is an example of a second discharge nozzle, the collection unit 61A is an example of a removal liquid collection unit, and the edge rinse nozzle 613 is an example of a peripheral portion removal liquid supply unit. Further, the substrate processing apparatus 100 is an example of a substrate processing apparatus, and the development processing unit 139 is an example of a development processing unit.

As each of constituent elements recited in the claims, various other elements having configurations or functions described in the claims can be also used.

INDUSTRIAL APPLICABILITY

The present invention can be effectively utilized for various types of processing.

The invention claimed is:

1. A film processing unit, comprising:
 a rotation holder that holds and rotates a substrate in a horizontal attitude;
 a processing liquid supplier that supplies a processing liquid to a surface to be processed of the substrate held by the rotation holder;
 a splash prevention member that is arranged to surround an outer peripheral end of the substrate held by the rotation holder, and receives the processing liquid splashed from the substrate rotated by the rotation holder;
 a removal liquid supplier that is configured to supply a first removal liquid for dissolving metal included in a metal-containing coating liquid, and a second removal liquid for dissolving a coating liquid included in the metal-containing coating liquid; and
 a guide member provided separately from the removal liquid supplier in the splash prevention member,
 wherein the guide member is configured to guide the first removal liquid that has been supplied by the removal liquid supplier to a first region of the splash prevention member, and guide the second removal liquid that has been supplied by the removal liquid supplier to a second region that is located at a position farther upward than a position of the first region of the splash prevention member.

2. The film processing unit according to claim 1, wherein the processing liquid supplier is configured to form a metal-containing coating film on the surface to be processed by supplying the metal-containing coating liquid to the surface to be processed of the substrate as the processing liquid.

3. A substrate processing apparatus that is arranged to be adjacent to an exposure device for performing exposure processing on a substrate, comprising:
 the film processing unit according to claim 2 that forms the metal-containing coating film on a surface to be processed of the substrate before the exposure processing is performed by the exposure device; and
 a development processing unit that performs development processing on the substrate after the exposure processing is performed by the exposure device.

4. The film processing unit according to claim 1, wherein
 a metal-containing coating film is formed by supply of the metal-containing coating liquid to the surface to be processed of the substrate, and then exposure processing is performed on the substrate, and
 the processing liquid supplier is configured to supply a development liquid as the processing liquid to the surface to be processed of the substrate on which the exposure processing has been performed.

5. A substrate processing apparatus that is arranged to be adjacent to an exposure device for performing exposure processing on a substrate, comprising:
 a film formation unit that forms a metal-containing coating film including metal to a surface to be processed of the substrate before the exposure processing is performed by the exposure device; and the film processing unit according to claim 4 that performs development processing on the substrate after the exposure processing is performed by the exposure device.

6. The film processing unit according to claim 1, further comprising a removal liquid collection unit that is provided to separately collect the first and second removal liquids that have been discharged to the splash prevention member.

7. The film processing unit according to claim 1, further comprising a peripheral portion removal liquid supply unit that supplies a third removal liquid for dissolving the metal to a peripheral portion of the surface to be processed of the substrate rotated by the rotation holder such that the metal-containing coating film remains in a region except for the peripheral portion of the surface to be processed of the substrate.

8. The film processing unit according to claim 1, further comprising a removal liquid collection unit that is provided to separately collect the first and second removal liquids that have been discharged to the splash prevention member.

9. The film processing unit according to claim 1, wherein the guide member includes
- a first removal liquid guide that guides the first removal liquid that has been supplied by the removal liquid supplier to the first region of the splash prevention member, and
- a second removal liquid guide that guides the second removal liquid that has been supplied by the removal liquid supplier to the second region of the splash prevention member.

10. The film processing unit according to claim 9, wherein the removal liquid supplier includes
- a first discharge nozzle that discharges the first removal liquid to the first removal liquid guide of the guide member, and
- a second discharge nozzle that discharges the second removal liquid to the second removal liquid guide of the guide member,
- the first removal liquid guide is provided to guide the first removal liquid that has been discharged from the first discharge nozzle to the first region of the splash prevention member, and
- the second removal liquid guide is provided to guide the second removal liquid that has been discharged from the second discharge nozzle to the second region of the splash prevention member.

11. The film processing unit according to claim 1, wherein the guide member is configured to selectively guide the first and second removal liquids, and
- a relative height of the splash prevention member relative to the guide member is changed such that the guide member guides the first removal liquid that has been supplied by the removal liquid supplier to the first region of the splash prevention member, and the removal liquid guide guides the second removal liquid that has been supplied by the removal liquid supplier to the second region of the splash prevention member.

12. The film processing unit according to claim 11, wherein the removal liquid supplier includes a discharge nozzle that selectively discharges the first and second removal liquids to the removal liquid guide of the guide member, and
- the guide member is provided to guide the first removal liquid that has been discharged from the discharge nozzle to the first region of the splash prevention member, and after the relative height of the splash prevention member relative to the guide member is changed, guide the second removal liquid that has been discharged from the discharge nozzle to the second region of the splash prevention member.

* * * * *